(12) United States Patent
Lim et al.

(10) Patent No.: US 11,011,208 B2
(45) Date of Patent: May 18, 2021

(54) SEMICONDUCTOR MEMORY DEVICE INCLUDING PARALLEL SUBSTRATES IN THREE DIMENSIONAL STRUCTURES

(71) Applicant: Samsung Electronics Co., Ltd., Suwon-si (KR)

(72) Inventors: Bongsoon Lim, Seoul (KR); Hojoon Kim, Hwasung-si (KR); Sang-won Park, Suwon-si (KR); Sang-won Shim, Seoul (KR); Wonbo Shim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/591,061

(22) Filed: Oct. 2, 2019

(65) Prior Publication Data
US 2020/0312379 A1     Oct. 1, 2020

(30) Foreign Application Priority Data
Mar. 26, 2019 (KR) .................. 10-2019-0034585

(51) Int. Cl.
| | | |
|---|---|---|
| G11C 5/02 | (2006.01) | |
| G11C 8/08 | (2006.01) | |
| G11C 8/06 | (2006.01) | |
| G11C 8/14 | (2006.01) | |
| G11C 5/06 | (2006.01) | |
| G11C 7/18 | (2006.01) | |
| G11C 8/18 | (2006.01) | |

(52) U.S. Cl.
CPC ............. *G11C 5/025* (2013.01); *G11C 5/063* (2013.01); *G11C 7/18* (2013.01); *G11C 8/06* (2013.01); *G11C 8/08* (2013.01); *G11C 8/14* (2013.01); *G11C 8/18* (2013.01)

(58) Field of Classification Search
CPC ........... G11C 5/025; G11C 5/063; G11C 8/18; G11C 8/08; G11C 8/14; G11C 8/06; G11C 7/18
See application file for complete search history.

(56) References Cited

U.S. PATENT DOCUMENTS

| | | |
|---|---|---|
| 7,679,133 B2 | 3/2010 | Son et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,165,654 B1 | 10/2015 | Oh et al. |
| 9,424,928 B2 | 8/2016 | Hwang et al. |
| 9,558,945 B2 | 1/2017 | Fukuzumi et al. |
| 9,941,009 B2 | 4/2018 | Lim et al. |

(Continued)

*Primary Examiner* — Sultana Begum
(74) *Attorney, Agent, or Firm* — Harness, Dickey & Pierce, P.L.C.

(57) ABSTRACT

A semiconductor memory device includes a substrate, first memory cells that are connected to first word lines extending along a first direction and first bit lines extending along a second direction, over the substrate, first conductive materials that are connected to the first word lines and extend from the first word lines along a third direction perpendicular to the first direction and the second direction, second conductive materials that are connected to the first bit lines and extend along the first direction over the first bit lines, and third conductive materials that are connected to the second conductive materials and extend from the second conductive materials along the third direction.

18 Claims, 15 Drawing Sheets

(56) References Cited

U.S. PATENT DOCUMENTS

| | | |
|---|---|---|
| 10,062,765 B2 | 8/2018 | Oh et al. |
| 2011/0233648 A1 | 9/2011 | Seol et al. |
| 2018/0277497 A1 | 9/2018 | Matsuo |
| 2020/0105348 A1* | 4/2020 | Kim ..................... G11C 16/08 |

* cited by examiner

SEMICONDUCTOR MEMORY DEVICE INCLUDING PARALLEL SUBSTRATES IN THREE DIMENSIONAL STRUCTURES

CROSS-REFERENCE TO RELATED APPLICATIONS

This application claims priority under 35 U.S.C. § 119 to Korean Patent Application No. 10-2019-0034585 filed on Mar. 26, 2019, in the Korean Intellectual Property Office, the disclosure of which is incorporated by reference herein in its entirety.

BACKGROUND

Embodiments of inventive concepts described herein relate, in general, to a semiconductor circuit, and more particularly, relate to a semiconductor memory device having a reduced size with a row decoder block and a page buffer block placed in parallel, and bit lines and word lines placed in parallel.

A semiconductor memory device may be used as a main memory or an auxiliary memory in various electronic devices such as a computer, a smartphone, and/or a smart watch. The semiconductor memory device includes a volatile memory device such as a dynamic random access memory (DRAM) and/or a static random access memory (SRAM). The semiconductor memory device may include a nonvolatile memory device such as a flash memory, a phase-change memory, a ferroelectric memory, a magnetic memory, and/or a resistive memory.

The semiconductor memory device may be manufactured by, e.g. fabricated, using substrate such as a wafer. A plurality of semiconductor memory devices may be simultaneously manufactured with one wafer. The number of semiconductor memory devices manufactured with one wafer has an influence on costs for manufacturing the semiconductor memory device. Costs for manufacturing a semiconductor memory device may decrease by decreasing the size of the semiconductor memory device, and thus increasing the number of semiconductor memory devices manufactured with one wafer.

A semiconductor memory device may include a memory cell array and a peripheral block. The memory cell array may include a plurality of memory cells configured to store data. The peripheral block may be configured to access the plurality of memory cells of the memory cell array. There is an attempt at a structure where the memory cell array and the peripheral block of the semiconductor memory device are stacked, e.g. vertically stacked, to decrease the size of the semiconductor memory device. However, a semiconductor memory device of a stacked structure, which accompanies a high yield and a low manufacturing cost, has not been proposed until now.

SUMMARY

Example embodiments of inventive concepts provide a semiconductor memory device having reduced manufacturing costs, improved design flexibility, and/or improved reliability.

According to some example embodiments, a semiconductor memory device includes a substrate, first word lines over the substrate, the first word lines extending in a first direction, first bit lines over the substrate, the first bit lines extending in a second direction, first memory cells connected to the first word lines and the first bit lines, first conductive materials connected to the first word lines and extending from the first word lines in a third direction, the third direction perpendicular to the first direction and the second direction, second conductive materials connected to the first bit lines and over the first bit lines, the second conductive materials extending in the first direction, and third conductive materials connected to the second conductive materials and extending in the third direction from the second conductive materials.

According to some example embodiments, a semiconductor memory device includes a substrate having an upper surface defined by a first direction and a second direction, a first row decoder structure extending in the second direction on a first area of the upper surface of the substrate, a first page buffer structure extending in the second direction on the first area of the upper surface of the substrate, first conductive materials over the row decoder structure, the first conductive materials connected to the first row decoder structure and extending in a third direction perpendicular to the first direction and the second direction, and second conductive materials over the first page buffer structure, the second conductive materials connected to the first page buffer structure and extending along the third direction.

According to some example embodiments, a semiconductor memory device includes a first substrate having an upper surface parallel to a first direction and a second direction crossing the first direction, a second substrate having an upper surface parallel to the first direction and the second direction, the upper surface of the second substrate facing the upper surface of the first substrate, memory cells over the upper surface of the substrate, the memory cells connected to word lines extending along the first direction and to bit lines extending along the second direction, first conductive materials connected to the word lines and extending from the word lines in a third direction perpendicular to the first direction and the second direction, second conductive materials connected to the bit lines and extending over the bit lines in the first direction, third conductive materials connected to the second conductive materials and extending from the second conductive materials in the third direction, a row decoder structure extending on the upper surface of the second substrate, the row decoder structure extending in the second direction, a page buffer structure on the upper surface of the second substrate, the page buffer structure extending in the second direction, fourth conductive materials connected to the row decoder structure and over the row decoder structure, extending in a direction facing away from the third direction, and connected to the first conductive materials, and fifth conductive materials over the page buffer structure connected to the page buffer structure, extending in the direction facing away from the third direction, and connected to the third conductive materials.

BRIEF DESCRIPTION OF THE FIGURES

The above and other objects and features of inventive concepts will become apparent by describing in detail example embodiments thereof with reference to the accompanying drawings.

DETAILED DESCRIPTION OF EXAMPLE EMBODIMENTS

Below, some example embodiments of inventive concepts may be described in detail and clearly to such an extent that one of ordinary skill in the art easily implements inventive concepts.

Figure 1:
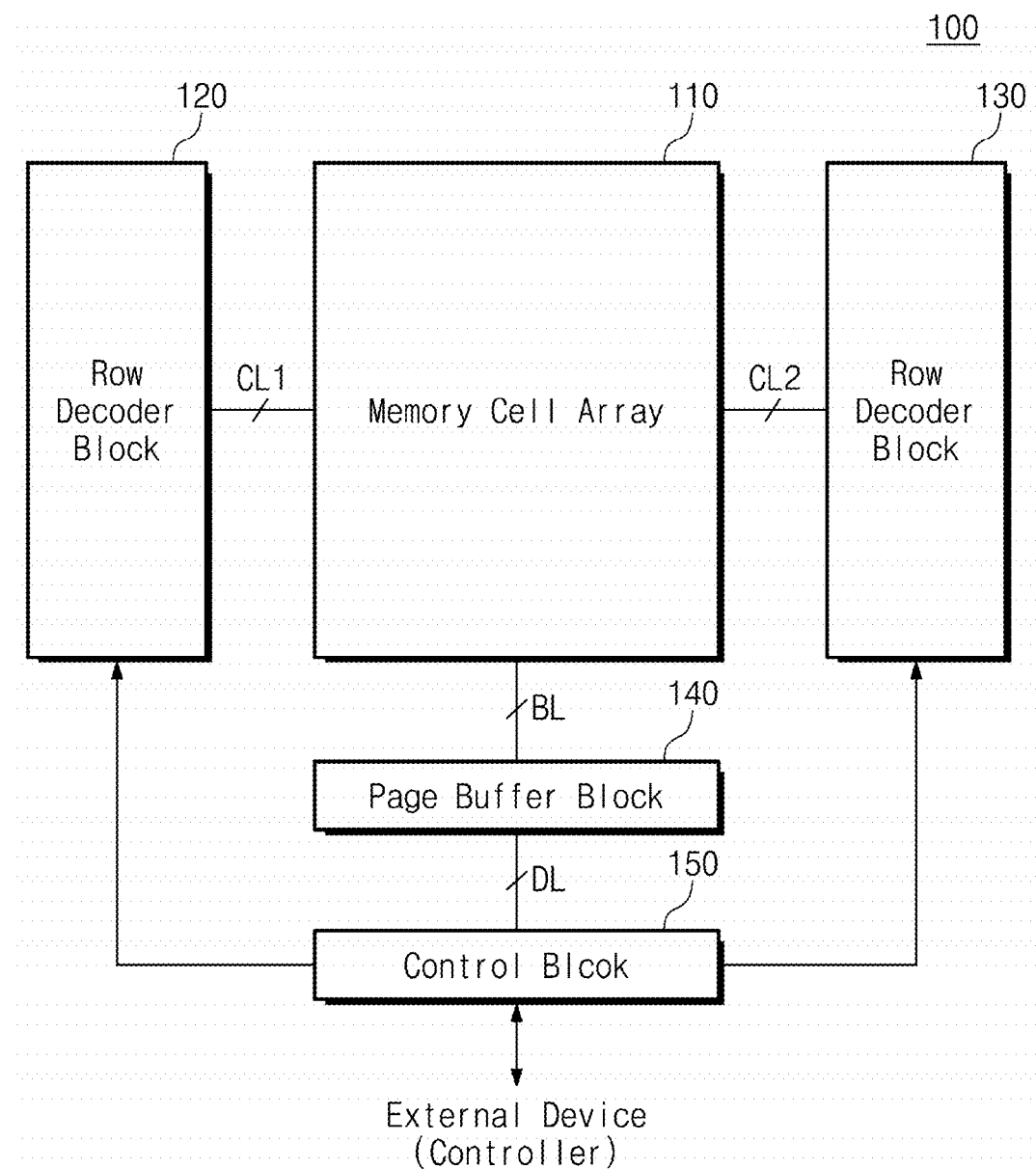
FIG. 1 is a block diagram illustrating a semiconductor memory device according to an example embodiment of inventive concepts.

FIG. 1 is a block diagram illustrating a semiconductor memory device 100 according to an example embodiment of inventive concepts. Referring to FIG. 1, the semiconductor memory device 100 may include a memory cell array 110, a first row decoder block 120, a second row decoder block 130, a page buffer block 140, and/or a control block 150.

The memory cell array 110 may include memory cells arranged in rows and columns. The memory cells may be connected to the first row decoder block 120 through first conductive lines CL1 and may be connected to the second row decoder block 130 through second conductive lines CL2. The memory cells may be connected to the page buffer block 140 through bit lines BL.

The first row decoder block 120 and the second row decoder block 130 may adjust voltages of the first conductive lines CL1 and the second conductive lines CL2 under control of the control block 150. The first row decoder block 120 and the second row decoder block 130 may control the first conductive lines CL1 and the second conductive lines CL2 in the same manner; however, inventive concepts are not limited thereto.

For example, the first conductive lines CL1 may be connected with the second conductive lines CL2 through conductive materials in the memory cell array 110. The first row decoder block 120 and the second row decoder block 130 may apply the same voltage to opposite ends of each of the conductive materials such that a voltage of each of the conductive materials within the memory cell array 110 is uniform.

The first row decoder block 120 may apply an activation voltage to a line selected from the first conductive lines CL1, and may apply a deactivation voltage to unselected lines. Likewise, the second row decoder block 130 may apply the activation voltage to a line selected from the second conductive lines CL2, and may apply the deactivation voltage to unselected lines.

An example where the memory cell array 110 is connected to the first row decoder block 120 and the second row decoder block 130 is illustrated in FIG. 1. However, the change or modification may be made such that the memory cell array 110 is connected to one, e.g. only one, row decoder block. The memory cell array 110 may be divided into memory blocks. For the purpose of a read operation, a write operation, and/or an erase operation, each of the memory blocks may be selected or may not be selected.

The page buffer block 140 is connected to the memory cell array 110 through the bit lines BL. The page buffer block 140 is connected to the control block 150 through data lines DL. The page buffer block 140 may write data provided from the control block 150 through the data lines DL in the memory cell array 110. For example, the page buffer block 140 may write data in memory cells, which are selected by the first row decoder block 120 and the second row decoder block 130, through the bit lines BL.

The page buffer block 140 may output data read from the memory cell array 110 to the control block 150 through the data lines DL. For example, the page buffer block 140 may read data from memory cells, which are selected by the first row decoder block 120 and the second row decoder block 130, through the bit lines BL and may output the read data to the control block 150 through the data lines DL.

The control block 150 may be configured to communicate with an external device (e.g., a controller to control the semiconductor memory device 100). For example, the control block 150 may receive an address, a command, data, and/or first control signals from the external device. Also, the control block 150 may provide data, a response, and/or second control signals to the external device.

The control block 150 may control the first row decoder block 120, the second row decoder block 130, and/or the page buffer block 140 based on the address, the command, and/or the first control signals received from the external device. The control block 150 may output the data received from the external device to the page buffer block 140 through the data lines DL. The control block 150 may output the data provided from the page buffer block 140 through the data lines DL to the external device.

The control block 150 may include various components (e.g., a physical (PHY) block) configured to communicate with the external device, various components (e.g., a state machine) configured to control the semiconductor memory device 100, and/or various components (e.g., a write chain, a read chain, a charge pump, a DC-DC converter, etc.) supporting an operation of writing data in the memory cell array 110 or reading data from the memory cell array 110.

The first row decoder block 120, the second row decoder block 130, the page buffer block 140, and/or the control block 150 may support an access to the memory cell array 110 and may be collectively referred to as a "peripheral block".

Figure 2:
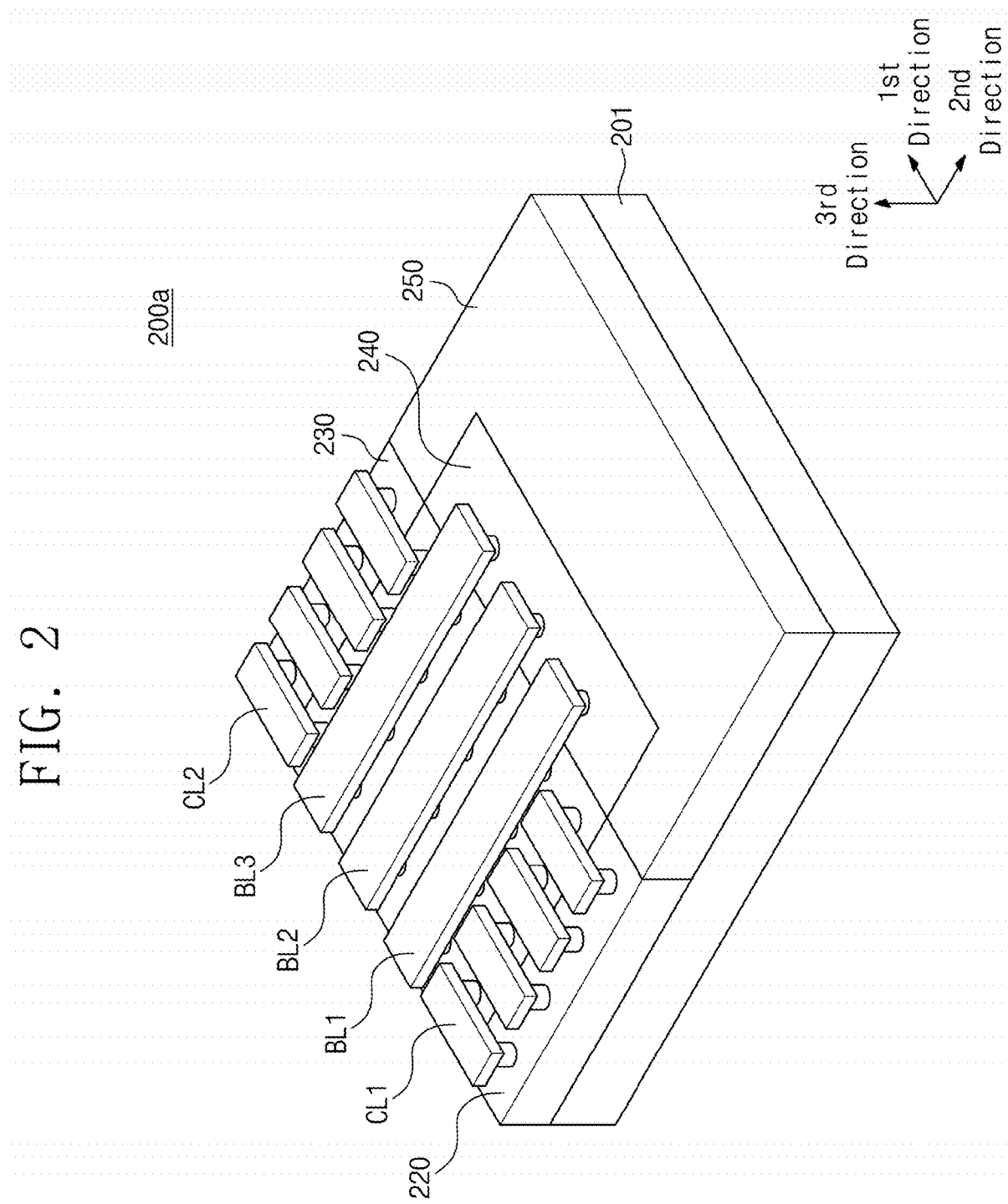
FIG. 2 illustrates a three-dimensional structure of a semiconductor memory device of FIG. 1, according to an example embodiment of inventive concepts.
Figure 3:
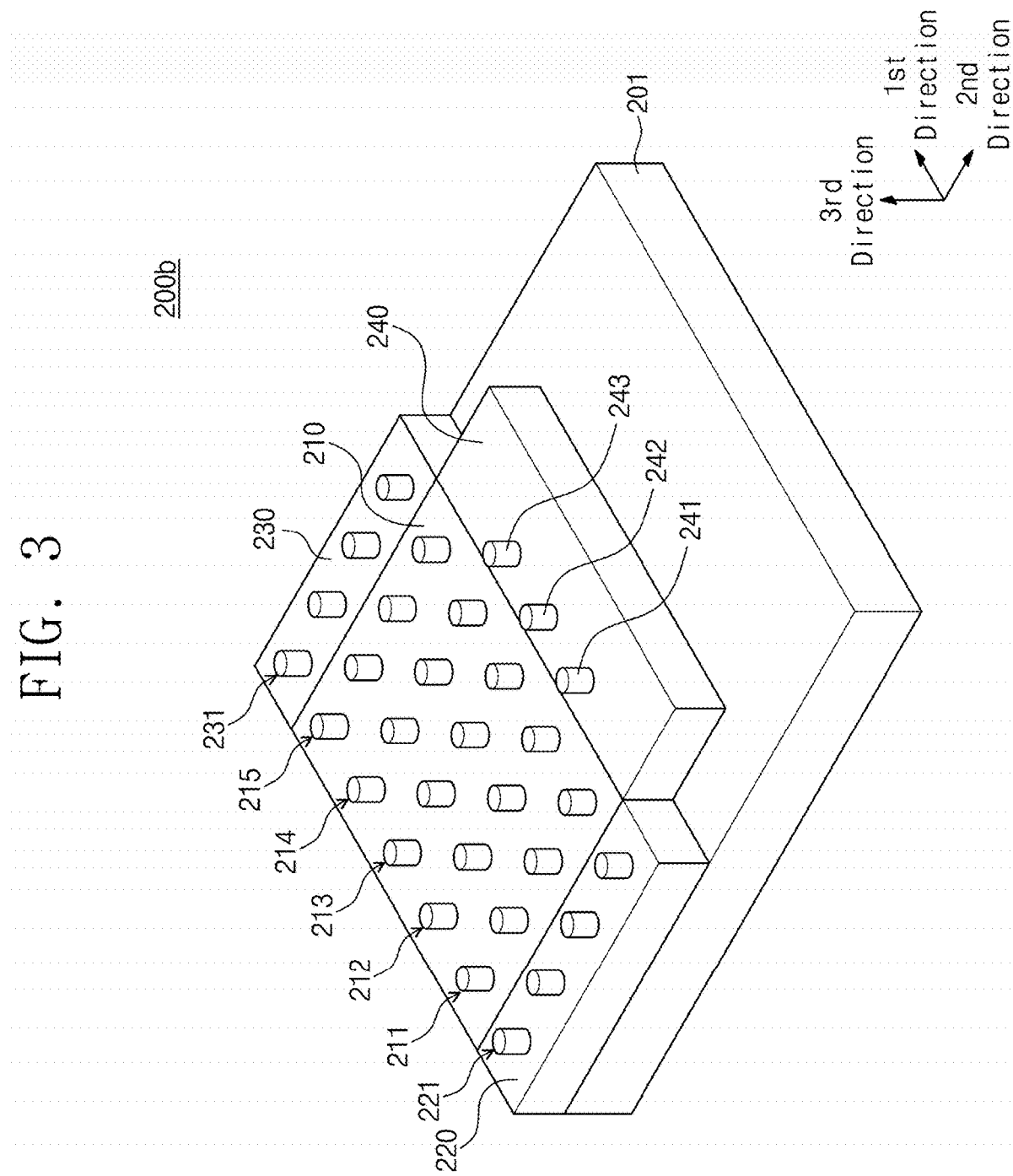
FIG. 3 illustrates a three-dimensional structure in which some components are omitted from a three-dimensional structure of FIG. 2, for a brief description.

FIG. 2 illustrates a three-dimensional structure 200a of the semiconductor memory device 100 of FIG. 1, according to an example embodiment of inventive concepts. FIG. 3 illustrates a three-dimensional structure 200b in which some components are omitted from the three-dimensional structure 200a of FIG. 2, for a brief description. Referring to FIGS. 1 to 3, the three-dimensional structure 200a/200b of the semiconductor memory device 100 may be placed, e.g. arranged, similarly to the block diagram of the semiconductor memory device 100.

The three-dimensional structure 200a/200b of the semiconductor memory device 100 may be disposed on a substrate 201. The substrate 201 may have an upper surface that corresponds to a plane defined by a first direction and a second direction. The second direction may be perpendicular to the first direction. A core structure 210 corresponding to the memory cell array 110 may be disposed on the upper surface of the substrate 201.

Below, the structure may be formed in an active area of the substrate 201 and may include active elements, which are placed in an area illustrated as the structure, such as transistors, passive elements such as resistors and/or capacitors, and a wiring of connecting the active elements and the passive elements between and amongst each other. The active elements and the passive elements of the structure may be organized through wirings so as to perform the above functions.

Referring to FIG. 3, first to fifth core contacts 211 to 215 that extend, e.g. extend vertically, from the core structure 210 along a third direction perpendicular to the substrate 201 may be arranged on the core structure 210. The first to fifth core contacts 211 to 215 may be arranged in a line along the second direction.

The first to fifth core contacts 211 to 215 may include conductive materials. The first to fifth core contacts 211 to 215 may be connected to rows of memory cells of the core structure 210. For example, the first and fifth core contacts 211 and 215 may be connected to word lines and/or selection lines (referring to FIGS. 14 and 15). The second to fourth core contacts 212 to 214 may be connected to columns of memory cells of the core structure 210.

A first row decoder structure 220 corresponding to the first row decoder block 120 in FIG. 1 may be disposed on the upper surface of the substrate 201, and on one side of the core structure 210. The side of the core structure 210 may face a direction opposite to the first direction. First row contacts 221 that extend from the first row decoder structure 220 along the third direction may be disposed on the first row decoder structure 220. The first row contacts 221 may be arranged in a line along the second direction. The first row contacts 221 may include conductive materials.

Reviewing FIGS. 1 and 2, the first core contacts 211 of the core structure 210 and the first row contacts 221 of the first row decoder structure 220 may be respectively connected through the first conductive lines CL1 extending in parallel along the first direction. The first row decoder structure 220 may apply voltages to the rows of the memory cells of the core structure 210 through the first conductive lines CL1.

A second row decoder structure 230 corresponding to the second row decoder block 130 in FIG. 1 may be disposed on the upper surface of the substrate 201, and on one side of the core structure 210. The side of the core structure 210 may face the second row decoder structure 230 in the first direction. Second row contacts 231 that extend from the second row decoder structure 230 along the third direction may be disposed on the second row decoder structure 230. The second row contacts 231 may be arranged in a line along the second direction. The second row contacts 231 may include conductive materials.

Reviewing FIGS. 2 and 3, the fifth core contacts 215 of the core structure 210 and the second row contacts 231 of the second row decoder structure 230 may be respectively connected through the second conductive lines CL2 extending in parallel along the first direction. The second row decoder structure 230 may apply voltages to the rows of the memory cells of the core structure 210 through the second conductive lines CL2.

A page buffer structure 240 corresponding to the page buffer block 140 in FIG. 1 may be disposed on the upper surface of the substrate 201 and on one side of the core structure 210. The side of core structure 210 may face the page buffer structure 240 in the second direction. First to third page buffer contacts 241 to 243 that extend from the page buffer structure 240 along the third direction may be disposed on the page buffer structure 240. The first to third page buffer contacts 241 to 243 may be arranged in a line along the first direction. The first to third page buffer contacts 241 to 243 may include conductive materials.

Reviewing FIGS. 2 and 3, the second core contacts 212 of the core structure 210 may be connected with the first page buffer contact 241 through a first bit line BL1 that extends along the second direction. The third core contacts 213 of the core structure 210 may be connected with the second page buffer contact 242 through a second bit line BL2 that extends along the second direction. The fourth core contacts 214 of the core structure 210 may be connected with the third page buffer contact 243 through a third bit line BL3 that extends along the second direction.

Reviewing FIG. 2, the first to third bit lines BL1 to BL3 may be arranged in parallel with each other. The first to third bit lines BL1 to BL3 may include conductive materials. The page buffer structure 240 may access columns of the memory cells of the core structure 210 through the first to third bit lines BL1 to BL3.

Reviewing FIG. 2, a control structure 250 corresponding to the control block 150 may be disposed on the upper surface of the substrate 201 and on one side, which face the first direction, of each of the first row decoder structure 220, the second row decoder structure 230, and the page buffer structure 240. For example, the first row decoder block 120, the second row decoder structure 230, and the page buffer structure 240 may be disposed on the upper surface of the substrate 201 in the form of surrounding the core structure 210. The control structure 250 may be placed in the remaining area of the upper surface of the substrate 201.

To reduce the size of the semiconductor memory device 100, a layer (e.g. a vertical layer) in which the core structure 210 corresponding to the memory cell array 110 is placed may be different from a layer (e.g. a vertical layer) in which the first row decoder structure 220, the second row decoder structure 230, the page buffer structure 240, and/or the control structure 250 corresponding to the peripheral block are placed.

For example, a core structure may be placed in a first layer. A control structure may be placed at a position of a second layer above or below the core structure; a first row decoder structure, a second row decoder structure, and a page buffer structure may be placed to surround the control structure. However, in this structure, a spare space for connecting the core structure with the first row decoder structure, the second row decoder structure, and the page buffer structure is present in the first layer. This means that efficiency of a space of the semiconductor memory device 100 may decrease, and/or a number of semiconductor memory devices placed on a wafer may be decreased.

Also, because the control structure is surrounded by the first row decoder structure, the second row decoder structure, and the page buffer structure, the control structure may be opened only in a single direction, and thus, the flexibility of design of the semiconductor memory device 100 may decrease.

Figure 4:
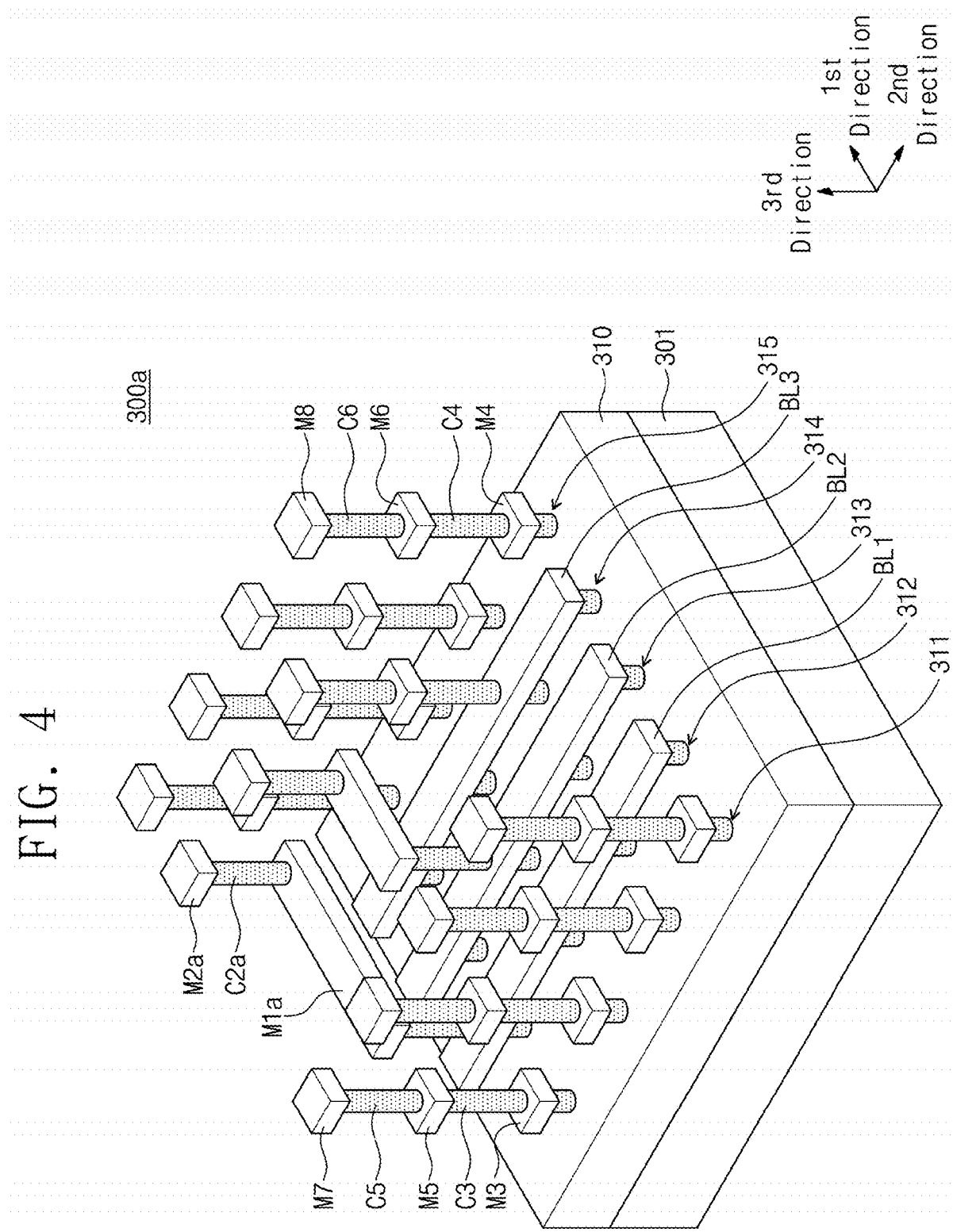
FIG. 4 illustrates a three-dimensional structure of a memory cell array of a semiconductor memory device of FIG. 1, according to an example embodiment of inventive concepts.
Figure 5:
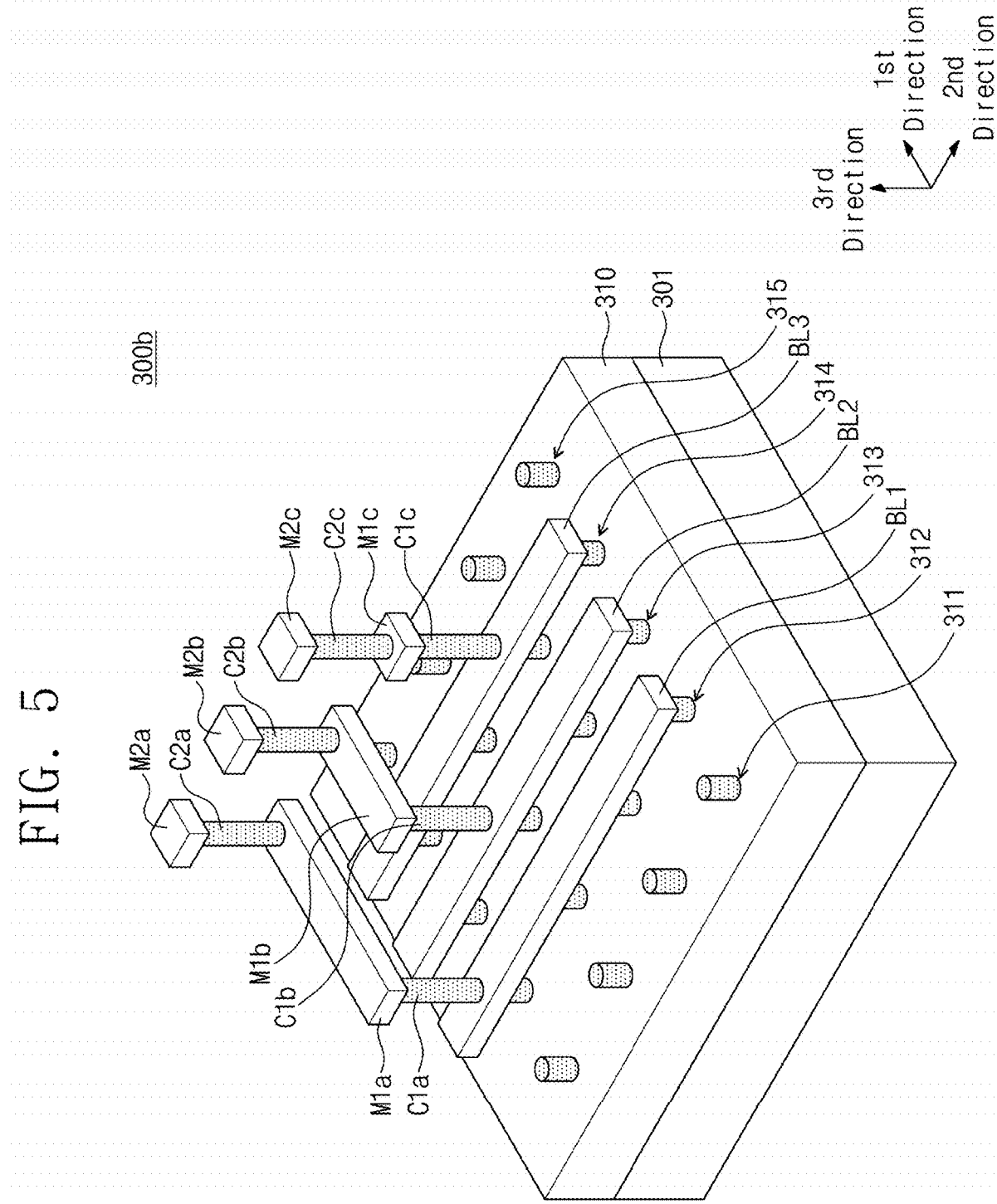
FIG. 5 illustrates a three-dimensional structure in which some components are omitted from a three-dimensional structure of FIG. 4, for a brief description.

FIG. 4 illustrates a three-dimensional structure 300*a* of the memory cell array 110 of the semiconductor memory device 100 of FIG. 1, according to an example embodiment of inventive concepts. FIG. 5 illustrates a three-dimensional structure 300*b* in which some components are omitted from the three-dimensional structure 300*a* of FIG. 4, for a brief description.

Referring to FIGS. 1, 4, and 5, the memory cell array 110 of the semiconductor memory device 100 may be manufactured separately, e.g. at a separate time, from that of a peripheral block. The three-dimensional structure 300*a*/300*b* of the semiconductor memory device 100 may be disposed on a substrate 301. The substrate 301 may have an upper surface that corresponds to a plane defined by the first direction and the second direction. The second direction may be perpendicular to the first direction.

A core structure 310 corresponding to the memory cell array 110 may be disposed on the upper surface of the substrate 301. First to fifth core contacts 311 to 315 that extend from the core structure 310 along the third direction may be arranged on the core structure 310. The third direction may be perpendicular to the first and second directions, and be perpendicular to the surface of the substrate. The first to fifth core contacts 311 to 315 may be arranged in a line along the second direction.

The first to fifth core contacts 311 to 315 may include conductive materials, such as a metal and/or polysilicon (e.g. doped polysilicon). The first to fifth core contacts 311 to 315 may be connected to rows of memory cells of the core structure 310. For example, the first and fifth core contacts 311 and 315 may be connected to word lines and selection lines (referring to FIGS. 14 and 15). Additionally, the second to fourth core contacts 312 to 314 may be connected to columns of memory cells of the core structure 310.

For example, the core structure 310 may have a two-dimensional structure including memory cells two-dimensionally arranged in rows and columns on the upper surface of the substrate 301. Alternatively or additionally, the core structure 310 may have a three-dimensional structure in which planes of memory cells are stacked on the upper surface of the substrate 301. Details of the two-dimensional structure and/or the three-dimensional structure are not illustrated in the core structure 310 of FIGS. 4 and 5.

The second core contacts 312 of the core structure 310 may be connected with or to the first bit line BL1 that extends along the second direction. The third core contacts 313 of the core structure 310 may be connected with or to the second bit line BL2 that extends along the second direction. The fourth core contacts 314 of the core structure 310 may be connected with or to the third bit line BL3 that extends along the second direction. The first to third bit lines BL1 to BL3 may be arranged in parallel with each other. The first to third bit lines BL1 to BL3 may include conductive materials. For example, the first to third bit lines BL1 to BL3 may include a metal and/or doped polysilicon.

Referring to FIG. 5, a 1*a*-th contact C1*a* that extends from the first bit line BL1 along the third direction may be disposed on the first bit line BL1. The 1*a*-th contact C1*a* may be connected to a 1*a*-th conductive material M1*a* extending along the first direction. A 2*a*-th contact C2*a* that extends from the 1*a*-th conductive material M1*a* along the third direction may be disposed on the 1*a*-th conductive material M1*a*. A 2*a*-th conductive material M2*a* may be disposed on the 2*a*-th contact C2*a*. The 1*a*-th contact C1*a* and the 2*a*-th contact C2*a* may include a conductive material. For example, the 1*a*-th contact C1*a* and the 2*a*-th contact C2*a* may include a metal and/or doped polysilicon.

Still referring to FIG. 5, a 1*b*-th contact C1*b* that extends from the second bit line BL2 along the third direction may be disposed on the second bit line BL2. The 1*b*-th contact C1*b* may be connected with or to a 1*b*-th conductive material M1*b* extending along the first direction. A 2*b*-th contact C2*b* that extends from the 1*b*-th conductive material M1*b* along the third direction may be disposed on the 1*b*-th conductive material M1*b*. A 2*b*-th conductive material M2*b* may be disposed on the 2*b*-th contact C2*b*. The 1*b*-th contact C1*b* and the 2*b*-th contact C2*b* may include a conductive material. For example, the 1*b*-th contact C1*a* and the 2*b*-th contact C2*a* may include a metal and/or doped polysilicon.

Still referring to FIG. 5, a 1*c*-th contact C1*c* that extends from the third bit line BL3 along the third direction may be disposed on the third bit line BL3. The 1*c*-th contact C1*c* may be connected with or to a 1*c*-th conductive material M1*c* extending along the first direction. A 2*c*-th contact C2*c* that extends from the 1*c*-th conductive material M1*c* along the third direction may be disposed on the 1*c*-th conductive material M1*c*. A 2*c*-th conductive material M2*c* may be disposed on the 2*c*-th contact C2*c*. The 1*c*-th contact C1*c* and the 2*c*-th contact C2*c* may include a conductive material. For example, the 1-*c*th contact and the 2*c*-th contact may include a metal and/or doped polysilicon.

The 1*a*-th to 1*c*-th conductive materials M1*a* to M1*c* may be parallel to one another and may extend along the first direction. The 2*a*-th to 2*c*-th contacts C2*a* to C2*c* and/or the 2*a*-th to 2*c*-th conductive materials M2*a* to M2*c* may be aligned on an edge of the upper surface of the substrate 301. For example, the 2*a*-th to 2*c*-th contacts C2*a* to C2*c* or the 2*a*-th to 2*c*-th conductive materials M2*a* to M2*c* may be arranged in a line along the second direction.

Referring to FIG. 4, third conductive materials M3, third contacts C3, fifth conductive materials M5, fifth contacts C5, and seventh conductive materials M7 may be sequentially disposed on the first core contacts 311 along the third direction. Fourth conductive materials M4, fourth contacts C4, sixth conductive materials M6, sixth contacts C6, and eighth conductive materials M8 may be sequentially disposed on the fifth core contacts 315 along the third direction.

Referring to FIG. 5, the 2*a*-th to 2*c*-th conductive materials M2*a* to M2*c* may be configured to be connected with an external device. For example, the 2*a*-th to 2*c*-th conductive materials M2*a* to M2*c* may be configured to be connected with or to the page buffer block 140 of the peripheral block (see FIG. 1). The 2*a*-th to 2*c*-th conductive materials M2*a* to M2*c* may be bonding pads.

Referring back to FIG. 4, the seventh conductive materials M7 may be configured to be connected with or to an external device. For example, the seventh conductive materials M7 may be configured to be connected with the first row decoder block 120 of the peripheral block. The seventh conductive materials M7 may be bonding pads. The eighth conductive materials M8 may be configured to be connected with or to an external device. For example, the eighth conductive materials M8 may be configured to be connected with or to the second row decoder block 130 of the peripheral block. The eighth conductive materials M8 may be bonding pads.

In FIGS. 2 and 3, the second to fourth core contacts 212 to 214 may be routed to the page buffer structure 240 through the first to third bit lines BL1 to BL3 extending along the second direction. Accordingly, in the three-dimensional structure 200a/200b of FIGS. 2 and 3, the page buffer structure 240 may be disposed on one side of the core structure 210, which faces the second direction, with a width (e.g., a length in the first direction) similar to the core structure 210.

In contrast, in non-limiting example embodiments according to FIGS. 4 and 5, the second to fourth core contacts 312 and 314 may be routed to the 2a-th to 2c-th conductive materials M2a to M2c, which are arranged in a line along the second direction, through the 1a-th to 1c-th conductive materials M1a to M1c extending in parallel along the first direction. Accordingly, the page buffer block 140 corresponding to the three-dimensional structure 300a/300b of the memory cell array 110 may not be limited to have a long side in the first direction, and instead may have a long side in the second direction.

In the three-dimensional structure 300a/300b of the memory cell array 110, the seventh conductive materials M7 (refer to FIG. 4) that are connected to the first row decoder block 120 are arranged in a line along the second direction on (e.g. over) the core structure 310. The eighth conductive materials M8 (refer to FIG. 4) that are connected to the second row decoder block 130 are arranged in a line along the second direction on/over the core structure 310.

Likewise, the 2a-th to 2c-th conductive materials M2a to M2c that are connected to the page buffer block 140 are also arranged in a line along the second direction on/over the core structure 310. Accordingly, because a spare space for routing connecting the memory cell array 110 and the peripheral block is unnecessary, e.g. not used or not required, the size of the semiconductor memory device 100 may be decreased, e.g. may be decreased as opposed to the semiconductor memory device 100 illustrated in FIGS. 2 and 3.

Figure 6:
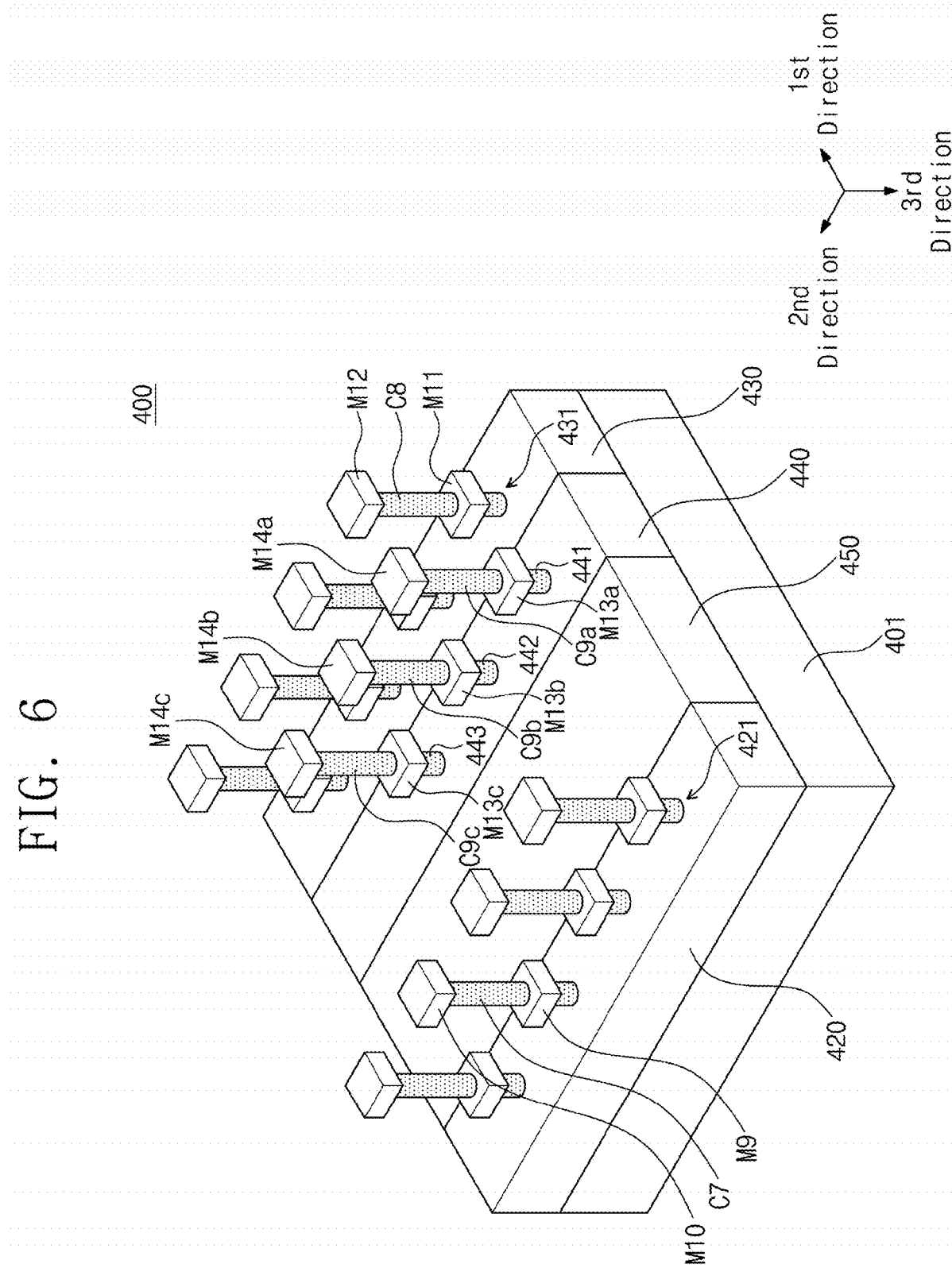
FIG. 6 illustrates a three-dimensional structure of a peripheral block including a first row decoder block, a second row decoder block, a page buffer block, and a control block of a semiconductor memory device of FIG. 1, according to an example embodiment of inventive concepts.

FIG. 6 illustrates a three-dimensional structure 400 of a peripheral block including the first row decoder block 120, the second row decoder block 130, the page buffer block 140, and the control block 150 of a semiconductor memory device of FIG. 1, according to an example embodiment of inventive concepts. Referring to FIGS. 1, 4, and 6, the three-dimensional structure 400 of the peripheral block may be disposed on a substrate 401. The substrate 401 may have an upper surface that corresponds to a plane defined by the first direction and the second direction.

A first row decoder structure 420 corresponding to the first row decoder block 120 may be placed at one edge of edges of the upper surface of the substrate 401. First row contacts 421 that extend from the first row decoder structure 420 along the opposite direction of the third direction may be disposed on the first row decoder structure 420. The first row contacts 421 may be arranged in a line along the second direction.

Ninth conductive materials M9, seventh contacts C7, and tenth conductive materials M10 may be disposed, e.g. sequentially disposed on the first row contacts 421 along the third direction. The seventh contacts C7 may include conductive materials, such as metals and/or doped polysilicon. The tenth conductive materials M10 may be configured to be connected with the seventh conductive materials M7 connected with the first core contacts 311. For example, the tenth conductive materials M10 may be bonding pads.

A second row decoder structure 430 corresponding to the second row decoder block 130 may be placed at another edge, which faces the one edge, from among the edges of the upper surface of the substrate 401. Second row contacts 431 that extend from the second row decoder structure 430 along the third direction may be disposed on the second row decoder structure 430. The second row contacts 431 may be arranged in a line along the second direction.

Eleventh conductive materials M11, eighth contacts C8, and twelfth conductive materials M12 may be sequentially disposed on the second row contacts 431 along the third direction. The eighth contacts C8 may include conductive materials, such as metals and/or doped polysilicon. The twelfth conductive materials M12 may be configured to be connected with the eighth conductive materials M8 connected with the fifth core contacts 315. For example, the twelfth conductive materials M12 may be bonding pads.

A page buffer structure 440 that has a long side parallel to a long side of the first row decoder structure 420 and a long side of the second row decoder structure 430 may be disposed on the upper surface of the substrate 401, so as to be interposed between the first row decoder structure 420 and the second row decoder structure 430. First to third page buffer contacts 441 to 443 that extend from the page buffer structure 440 along the third direction may be disposed on the page buffer structure 440.

The first to third page buffer contacts 441 to 443 may be arranged in a line extending along the second direction. 13a-th to 13c-th conductive materials M13a to M13c, 9a-th to 9c-th contacts C9a to C9c, and 14a-th to 14c-th conductive materials M14a to M14c may be disposed, e.g. sequentially disposed, on the first to third page buffer contacts 441 to 443 so as to be stacked along the third direction.

The 9a-th to 9c-th contacts C9a to C9c may include conductive materials such as metals and/or doped polysilicon. The 14a-th to 14c-th conductive materials M14a to M14c may be configured to be respectively connected with the 2a-th to 2c-th conductive materials M2a to M2c connected with the first to third bit lines BL1 to BL3 (refer to FIGS. 4 and 5). A control structure 450 may be placed in the remaining space of the upper surface of the substrate 401.

As described with reference to FIGS. 4 to 6, the page buffer structure 440 may be placed parallel to the first row decoder structure 420 and the second row decoder structure 430 by arranging the 2a-th to 2c-th conductive materials M2a to M2c connected with columns of memory cells of the core structure 310 in a line along the second direction. The control structure 450 may be opened bi-directionally, and thus, the flexibility of design of the semiconductor memory device 100 may be improved.

The first row decoder structure 420, the second row decoder structure 430, the page buffer structure 440, and/or the control structure 450 may have the same size as the control structure 450. Because a spare space for routing of wires connecting the memory cell array 110 and the peripheral block is unnecessary and/or not used, the size of the semiconductor memory device 100 may decrease, e.g. may decrease as opposed to the semiconductor memory device illustrated in FIGS. 2 and 3.

Figure 7:
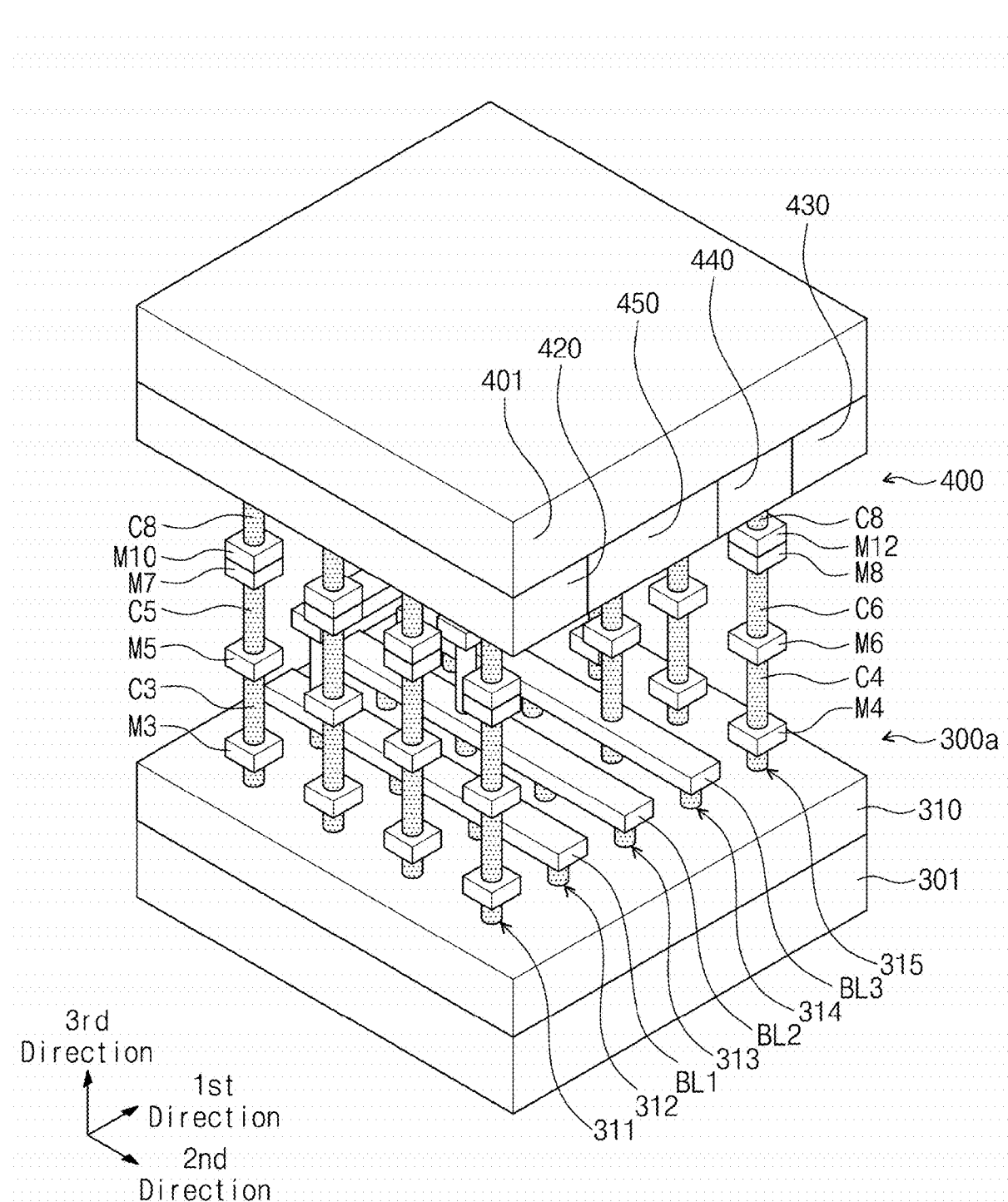
FIG. 7 illustrates an example in which a three-dimensional structure of a memory cell array of FIG. 4 and a three-dimensional structure of a peripheral block of FIG. 6 are combined.

The three-dimensional structure 300a of the memory cell array 110 of FIG. 4 and the three-dimensional structure 400 of the peripheral block of FIG. 6 may be manufactured independently of each other, e.g. may be manufactured on or fabricated on different wafers, and then may then be combined. FIG. 7 illustrates an example in which the three-dimensional structure 300a of the memory cell array 110 of FIG. 4 and the three-dimensional structure 400 of the peripheral block of FIG. 6 are combined. Referring to FIGS. 1, 4, 6, and 7, the three-dimensional structure 400 of the peripheral block may be rotated by 180 degrees around the first direction and may then be combined with the three-dimensional structure 300a of the memory cell array 110.

A separate space for routing connecting the three-dimensional structure 300a of the memory cell array 110 and the three-dimensional structure 400 of the peripheral block of FIG. 6 is not used, e.g. is not required. The three-dimensional structure 400 of the peripheral block may have the same area as the three-dimensional structure 300a of the memory cell array 110. For example, the semiconductor memory device 100 may have the same size as the three-dimensional structure 300a of the memory cell array 110.

In general, a structure of the memory cell array 110 and a structure of the peripheral block are different. For example, the memory cell array 110 may have a simple structure in which memory cells are repeatedly laid out, e.g. repeatedly laid out in a rectangular grid. The peripheral block is configured to perform various control and logic functions and may have a complicated structure, e.g. a more complicated structure than that of a rectangular grid or array.

As described with reference to FIGS. 4 to 7, as the memory cell array 110 and the peripheral block are separately manufactured and are then combined, the yield of the semiconductor memory device 100 may be improved.

For example, when the memory cell array 110 and the peripheral block are manufactured with, e.g. fabricated with, one wafer, a process in which distinct characteristics of the memory cell array 110 are applied and a process in which distinct characteristics of the peripheral block are applied may be alternatively performed. The process of the memory cell array 110 may stress a structure of the peripheral block manufactured in advance. Alternatively, the process of the peripheral block may stress a structure of the memory cell array 110 manufactured in advance.

When only structures of the memory cell array 110 are manufactured with, e.g. fabricated with, one wafer, the stress due to the process of the peripheral block may occur. Further, when only structures of the peripheral block are manufactured with, e.g. fabricated with, another wafer, the stress due to the process of the memory cell array 110 may not occur.

When the structure 300a of the memory cell array 110 and the structure 400 of the peripheral block are manufactured with different wafers and are then combined, the above process stress may decrease, thus improving the yield and/or reliability of the semiconductor memory device 100.

Figure 8:
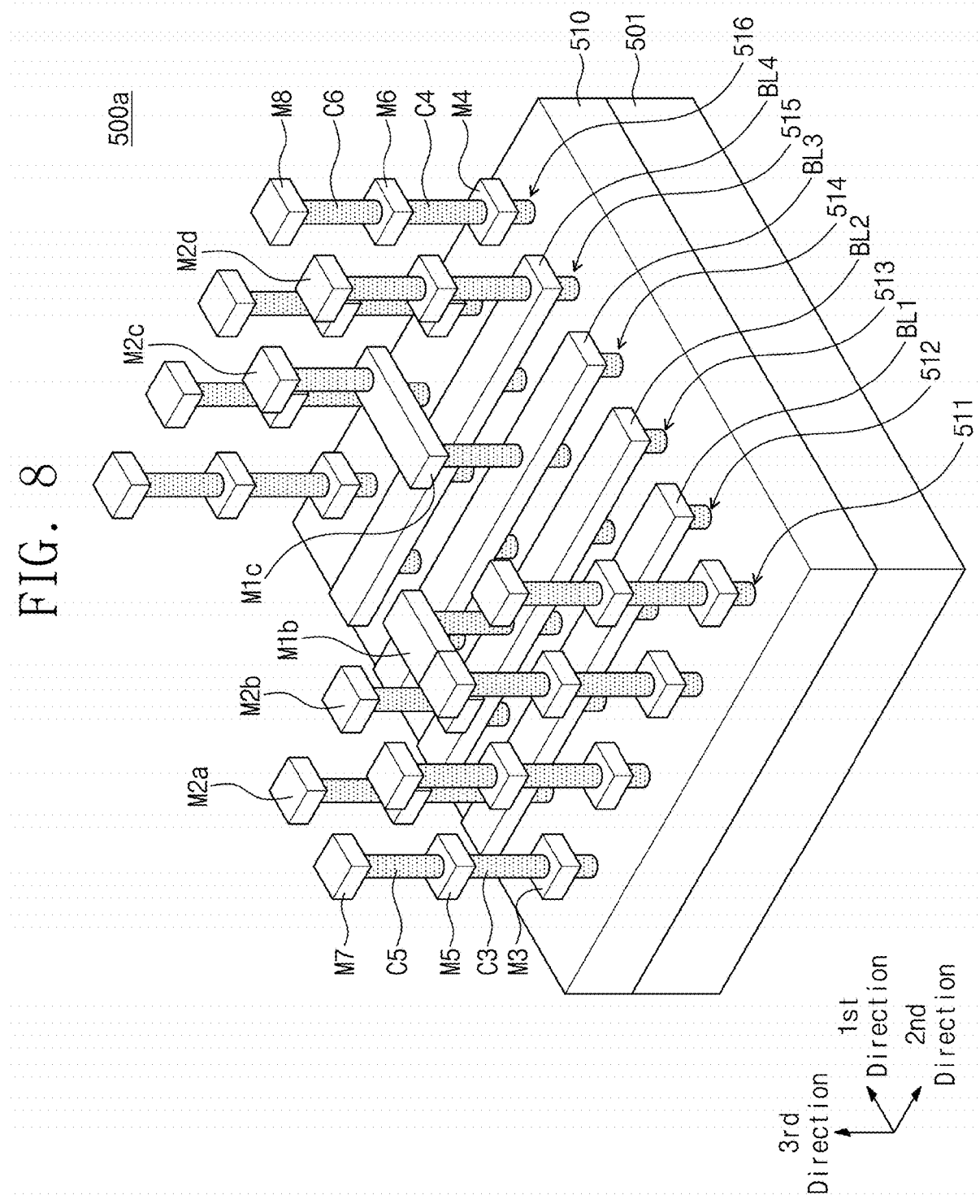
FIG. 8 illustrates a three-dimensional structure of a memory cell array of a semiconductor memory device of FIG. 1, according to an example embodiment of inventive concepts.
Figure 9:
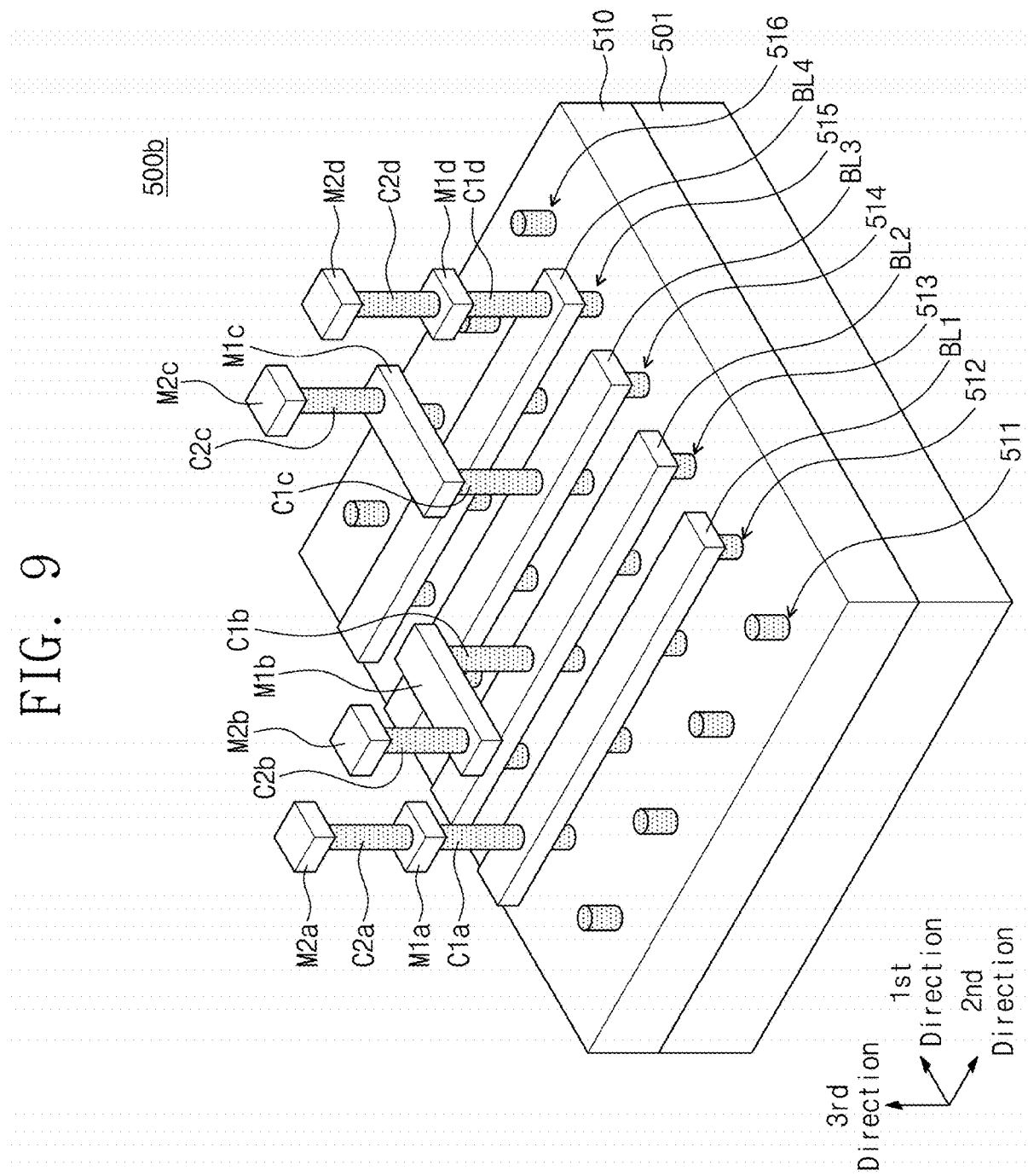
FIG. 9 illustrates a three-dimensional structure in which some components are omitted from a three-dimensional structure of FIG. 8, for a brief description.

FIG. 8 illustrates a three-dimensional structure 500a of the memory cell array 110 of the semiconductor memory device 100 of FIG. 1, according to an example embodiment of inventive concepts. FIG. 9 illustrates a three-dimensional structure 500b in which some components are omitted from the three-dimensional structure 500a of FIG. 8, for brevity of description.

Referring to FIGS. 1, 8, and 9, the memory cell array 110 of the semiconductor memory device 100 may be manufactured separately from the peripheral block. For example, the memory cell array 110 of the semiconductor memory device 100 may be fabricated or manufactured on different substrates, e.g. different wafers. The three-dimensional structure 500a/500b of the semiconductor memory device 100 may be disposed on a substrate 501. The substrate 501 may have an upper surface that corresponds to a plane defined by the first direction and the second direction.

A core structure 510 corresponding to the memory cell array 110 may be disposed on the upper surface of the substrate 501. First to sixth core contacts 511 to 516 that extend from the core structure 510 along the third direction perpendicular to the substrate 501 may be arranged on the core structure 510. The first to sixth core contacts 511 to 516 may be arranged in a line along the second direction.

The first to sixth core contacts 511 to 516 may include conductive materials, e.g. may include metals and/or doped polysilicon. The first to sixth core contacts 511 to 516 may be connected to rows of memory cells of the core structure 510. The second to fifth core contacts 512 to 515 may be connected to columns of memory cells of the core structure 510.

The second to fifth core contacts 512 to 515 of the core structure 510 may be connected with first to fourth bit lines BL1 to BL4 that extend along the second direction. The first to fourth bit lines BL1 to BL4 may be arranged in parallel with each other. The first to fourth bit lines BL1 to BL4 may include conductive materials, e.g. may include metals and/or doped polysilicon.

As described with reference to FIGS. 4 and 5, the 1a-th contact C1a, the 1a-th conductive material M1a, the 2a-th contact C2a, and the 2a-th conductive material M2a may be sequentially disposed on the first bit line BL1. The 1a-th conductive material M1a of FIGS. 4 and 5 may extend from the 1a-th contact C1a along the first direction, while the 1a-th conductive material M1a of FIGS. 8 and 9 may extend from the 1a-th contact C1a in a direction opposite to the first direction. Accordingly, the 2a-th conductive material M2a of FIGS. 4 and 5 may be placed adjacent to the eighth conductive materials M8, while the 2a-th conductive material M2a of FIGS. 8 and 9 may be placed adjacent to the seventh conductive material M7.

As described with reference to FIGS. 4 and 5, the 1b-th contact C1b, the 1b-th conductive material M1b, the 2b-th contact C2b, and the 2b-th conductive material M2b may be sequentially disposed on the second bit line BL2. The 1b-th conductive material M1b of FIGS. 4 and 5 may extend from the 1b-th contact C1b along the first direction, while the 1b-th conductive material M1b of FIGS. 8 and 9 may extend from the 1b-th contact C1b in the direction opposite to the first direction. Accordingly, the 2b-th conductive material M2b of FIGS. 4 and 5 may be placed adjacent to the eighth conductive materials M8, while the 2b-th conductive material M2b of FIGS. 8 and 9 may be placed adjacent to the seventh conductive materials M7.

As described with reference to FIGS. 4 and 5, the 1c-th contact C1c, the 1c-th conductive material M1c, the 2c-th contact C2c, and the 2c-th conductive material M2c may be sequentially disposed on the third bit line BL3. The 1c-th conductive material M1c may extend from the 1c-th contact C1c in the first direction. The 2c-th conductive material M2c may be placed adjacent to the eighth conductive materials M8.

As illustrated in FIG. 9, a 1d-th contact C1d, a 1d-th conductive material M1d, a 2d-th contact C2d, and a 2d-th conductive material M2d may be sequentially disposed on the fourth bit line BL4. The 1d-th conductive material M1d may extend from the 1d-th contact C1d in the first direction.

The 2d-th conductive material M2d may be placed adjacent to the eighth conductive materials M8.

Comparing non-limiting example embodiments of FIG. 5 with non-limiting example embodiments of FIG. 9, a length of the conductive materials M1a to M1d extending from the bit lines BL1 to BL4 in the first direction (or a direction opposite to the first direction) become shorter, e.g. shorter than those of FIG. 5. Accordingly, the load of the conductive materials M1a to M1d may decrease, and an operating speed of the semiconductor memory device 100 may be improved, e.g. improved with respect to the operating speed of the semiconductor memory device 100 according to FIG. 5.

As described with reference to FIGS. 4 and 5, the conductive materials M3, the third contacts C3, the fifth conductive materials M5, the fifth contacts C5, and the seventh conductive materials M7 may be sequentially disposed on the first core contacts 511 along the third direction. The fourth conductive materials M4, the fourth contacts C4, the sixth conductive materials M6, the sixth contacts C6, and the eighth conductive materials M8 may be sequentially disposed on the sixth core contacts 516 along the third direction.

Figure 10:
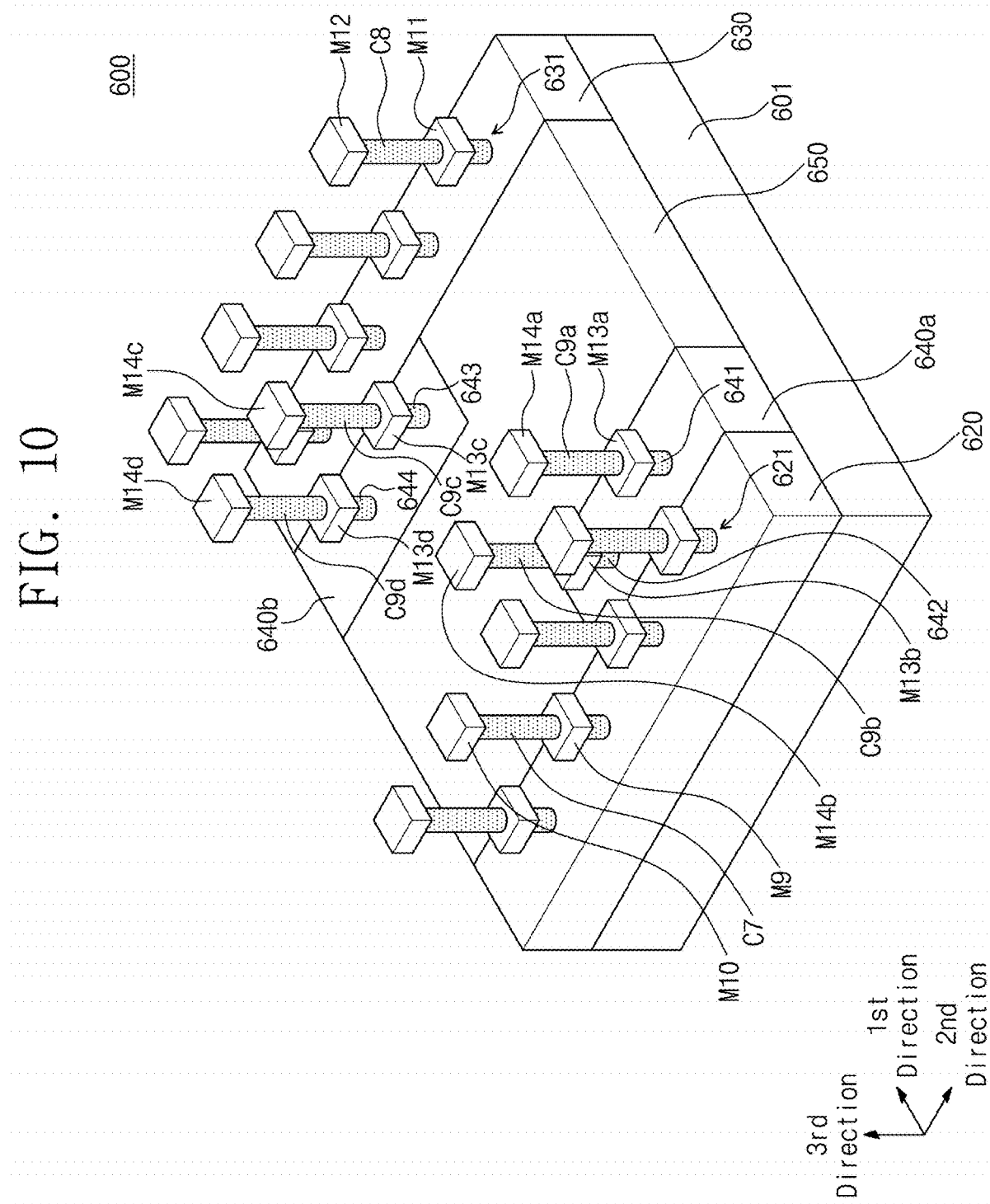
FIG. 10 illustrates a three-dimensional structure of a peripheral block including a first row decoder block, a second row decoder block, a page buffer block, and a control block of a semiconductor memory device of FIG. 1, according to an example embodiment of inventive concepts.

FIG. 10 illustrates a three-dimensional structure 600 of a peripheral block including the first row decoder block 120, the second row decoder block 130, the page buffer block 140, and the control block 150 of a semiconductor memory device of FIG. 1, according to an example embodiment of inventive concepts. Referring to FIGS. 1 and 8 to 10, the three-dimensional structure 600 of the peripheral block may be disposed on a substrate 601. The substrate 601 may have an upper surface that corresponds to a plane defined by the first direction and the second direction.

As described with reference to FIG. 6, a first row decoder structure 620 and a second row decoder structure 630 respectively corresponding to the first row decoder block 120 and the second row decoder block 130 may be placed at edges, which face each other, from among edges of the upper surface of the substrate 601. First row contacts 621 that extend from the first row decoder structure 620 along the third direction may be disposed on the first row decoder structure 620. The first row contacts 621 may be arranged in a line along the second direction.

The ninth conductive materials M9, the seventh contacts C7, and the tenth conductive materials M10 may be sequentially disposed on the first row contacts 421 along the third direction. The seventh contacts C7 may include conductive materials. The tenth conductive materials M10 may be configured to be connected with the seventh conductive materials M7 connected with the first core contacts 311. For example, the tenth conductive materials M10 may be bonding pads.

Second row contacts 631 that extend from the second row decoder structure 630 along the third direction may be disposed on the second row decoder structure 630. The second row contacts 631 may be arranged in a line along the second direction.

The eleventh conductive materials M11, the eighth contacts C8, and the twelfth conductive materials M12 may be sequentially disposed on the second row contacts 631 along the third direction. The eighth contacts C8 may include conductive materials. The twelfth conductive materials M12 may be configured to be connected with the eighth conductive materials M8 connected with the fifth core contacts 315. For example, the twelfth conductive materials M12 may be bonding pads.

A first page buffer structure 640a and a second page buffer structure 640b may be disposed on the upper surface of the substrate 601 so as to be interposed between the first row decoder structure 620 and the second row decoder structure 630. Each of the first page buffer structure 640a and the second page buffer structure 640b may have a long side parallel to a long side of the first row decoder structure 620 and a long side of the second row decoder structure 630.

In an example embodiment, the first page buffer structure 640a may be placed adjacent to the first row decoder structure 620, and the second page buffer structure 640b may be placed adjacent to the second row decoder structure 630. First and second page buffer contacts 641 and 642 that extend from the first page buffer structure 640a along the third direction may be disposed on the first page buffer structure 640a. The first and second page buffer contacts 641 and 642 may be arranged in a line along the second direction.

Third and fourth page buffer contacts 643 and 644 that extend from the second page buffer structure 640b along the third direction may be disposed on the second page buffer structure 640b. The third and fourth page buffer contacts 643 and 644 may be arranged in a line along the second direction.

The 13a-th to 13d-th conductive materials M13a to M13d, 9a-th to 9d-th contacts C9a to C9d, and 14a-th to 14d-th conductive materials M14a to M14d may be sequentially disposed on the first to fourth page buffer contacts 641 to 644 so as to be stacked along the third direction.

The 9a-th to 9d-th contacts C9a to C9d may include conductive materials. The 14a-th to 14d-th conductive materials M14a to M14d may be configured to be respectively connected with the 2a-th to 2d-th conductive materials M2a to M2d connected with the first to fourth bit lines BL1 to BL4. A control structure 650 may be disposed in the remaining space of the upper surface of the substrate 601.

As described with reference to FIG. 7, the three-dimensional structure 500a of the memory cell array 110 of FIG. 8 may be combined with the three-dimensional structure 600 of the peripheral block of FIG. 10. The load of the first to fourth bit lines BL1 to BL4 may decrease by dividing the page buffer block 140 into the first page buffer structure 640a and the second page buffer structure 640b.

Also, the flexibility of design of the semiconductor memory device 100 may be improved by dividing the page buffer block 140 into the first page buffer structure 640a and the second page buffer structure 640b. For example, a length (e.g., a length in the second direction) of a long side of each of the first page buffer structure 640a and the second page buffer structure 640b may become longer or shorter than a length of the core structure 510 in the second direction.

That is, even in the case where a length of the core structure 510 in the first direction and a length of the core structure 510 in the second direction are different, the first page buffer structure 640a and the second page buffer structure 640b may be designed such that the total length of the core structure 510 in the second direction is equal to the length of the core structure 510 in the first direction.

The number of core contacts of the memory cell array 110, the number of first and second row contacts of the first and second row decoder blocks 120 and 130, and the number of buffer contacts of the page buffer block 140 are specifically illustrated in FIGS. 4 to 10 for convenience of description. However, the number of contacts associated with each of the above components is, but is not limited to, an example. The number of contacts may vary with the number of rows of memory cells included in the memory cell array 110 and the number of column of memory cells included therein.

In FIGS. 4 to 10, contacts and conductive materials connected with the three-dimensional structure 300a or 500a of the memory cell array 110 and the three-dimensional structure 400 or 600 of the peripheral block are specifically illustrated for convenience of description. However, the number of contacts and the number of conductive materials are examples only, and may be changed according to a characteristic of the semiconductor memory device 100.

In FIGS. 8 to 10, the description is given as the page buffer block 140 is implemented with the two page buffer structures 640a and 640b. However, inventive concepts are not limited thereto, and the page buffer block 140 may be implemented with three or more page buffer structures. The three or more page buffer structures may be placed alternately adjacent to the first row decoder structure 620 and the second page buffer structure 630.

Figure 11:
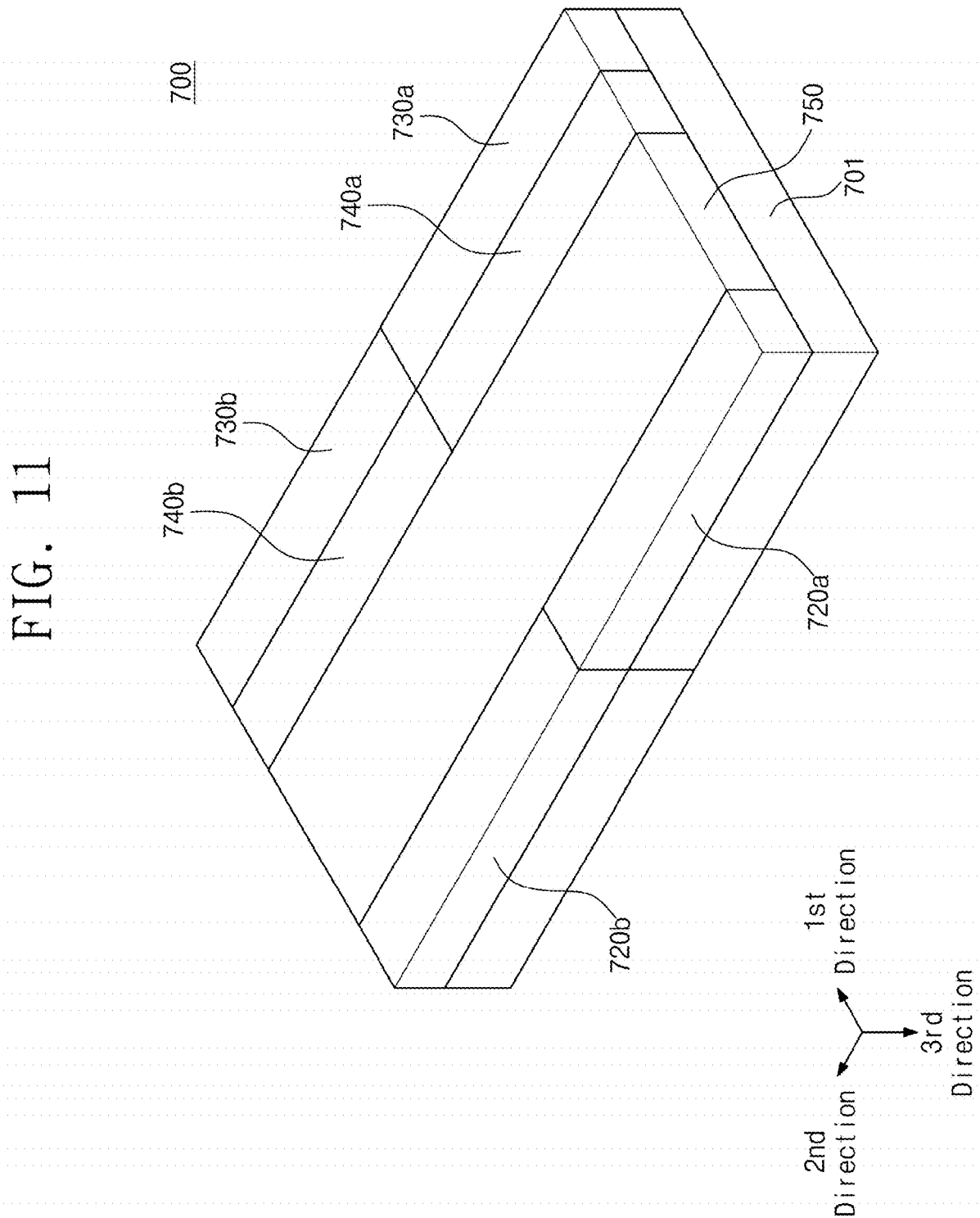
FIG. 11 illustrates a three-dimensional structure of a peripheral block corresponding to two independent memory cell arrays.

FIG. 11 illustrates a three-dimensional structure 700 of a peripheral block corresponding to two independent memory cell arrays. For example, the three-dimensional structure 700 of the peripheral block corresponding to the case where the three-dimensional structures 300a described with reference to FIG. 4 are sequentially arranged along the second direction is illustrated in FIG. 11.

Referring to FIG. 11, two first row decoder structures 720a and 720b may be sequentially arranged on a substrate 701 along the second direction with regard to two memory cell arrays. Two second row decoder structures 730a and 730b may be sequentially arranged along the second direction with regard to the two memory cell arrays. Two page buffer structures 740a and 740b may be sequentially arranged along the second direction with regard to the two memory cell arrays.

A control structure 750 may be provided in common with regard to the two memory cell arrays. For example, because the three-dimensional structure 700 of the peripheral block is opened bi-directionally, the control structure 750 may be provided in common with regard to the two memory cell arrays. Accordingly, a design including only one circuit applied in common to two memory cell arrays and two peripheral blocks may be provided, and the flexibility of design may be improved. Alternatively or additionally, manufacturing costs and/or the size of the semiconductor memory device 100 may decrease.

Figure 12:
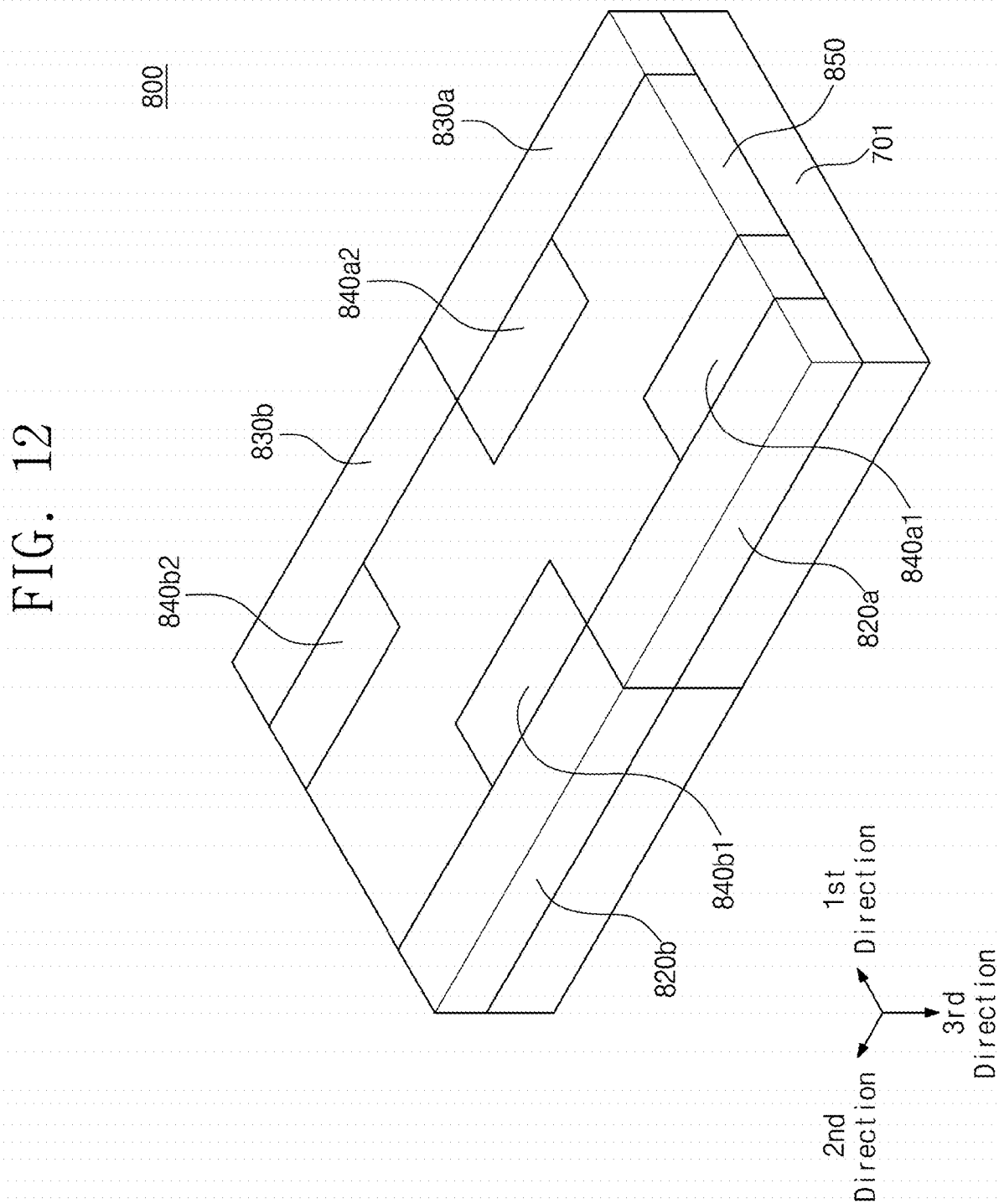
FIG. 12 illustrates another example of a three-dimensional structure of a peripheral block corresponding to two independent memory cell arrays.

FIG. 12 illustrates an example of a three-dimensional structure 800 of a peripheral block corresponding to two independent memory cell arrays. For example, the three-dimensional structure 800 of the peripheral block corresponding to the case where the three-dimensional structures 500a described with reference to FIG. 8 are sequentially arranged along the second direction is illustrated in FIG. 12. A semiconductor device may have a block including features of FIG. 12, and another block including features of FIG. 11. That is, a semiconductor device according to example embodiments are not limited to be one of FIG. 11 and one of FIG. 12, and instead may include features of both FIG. 11 and FIG. 12.

Referring to FIG. 12, two first row decoder structures 820a and 820b may be sequentially arranged on a substrate 801 along the second direction with regard to two memory cell arrays. Two second row decoder structures 830a and 830b may be sequentially arranged along the second direction with regard to the two memory cell arrays.

Two first page buffer structures 840a1 and 840b1 may be sequentially arranged along the second direction with regard to the two memory cell arrays. Two second page buffer structures 840a2 and 840b2 may be sequentially arranged along the second direction with regard to the two memory cell arrays.

A control structure 850 may be provided in common with regard to the two memory cell arrays. For example, because the three-dimensional structure 800 of the peripheral block is opened bi-directionally, the control structure 850 may be provided in common with regard to the two memory cell arrays. Accordingly, the flexibility of design of the semiconductor memory device 100 may be improved, and manufacturing costs and the size of the semiconductor memory device 100 may decrease.

Figure 13:
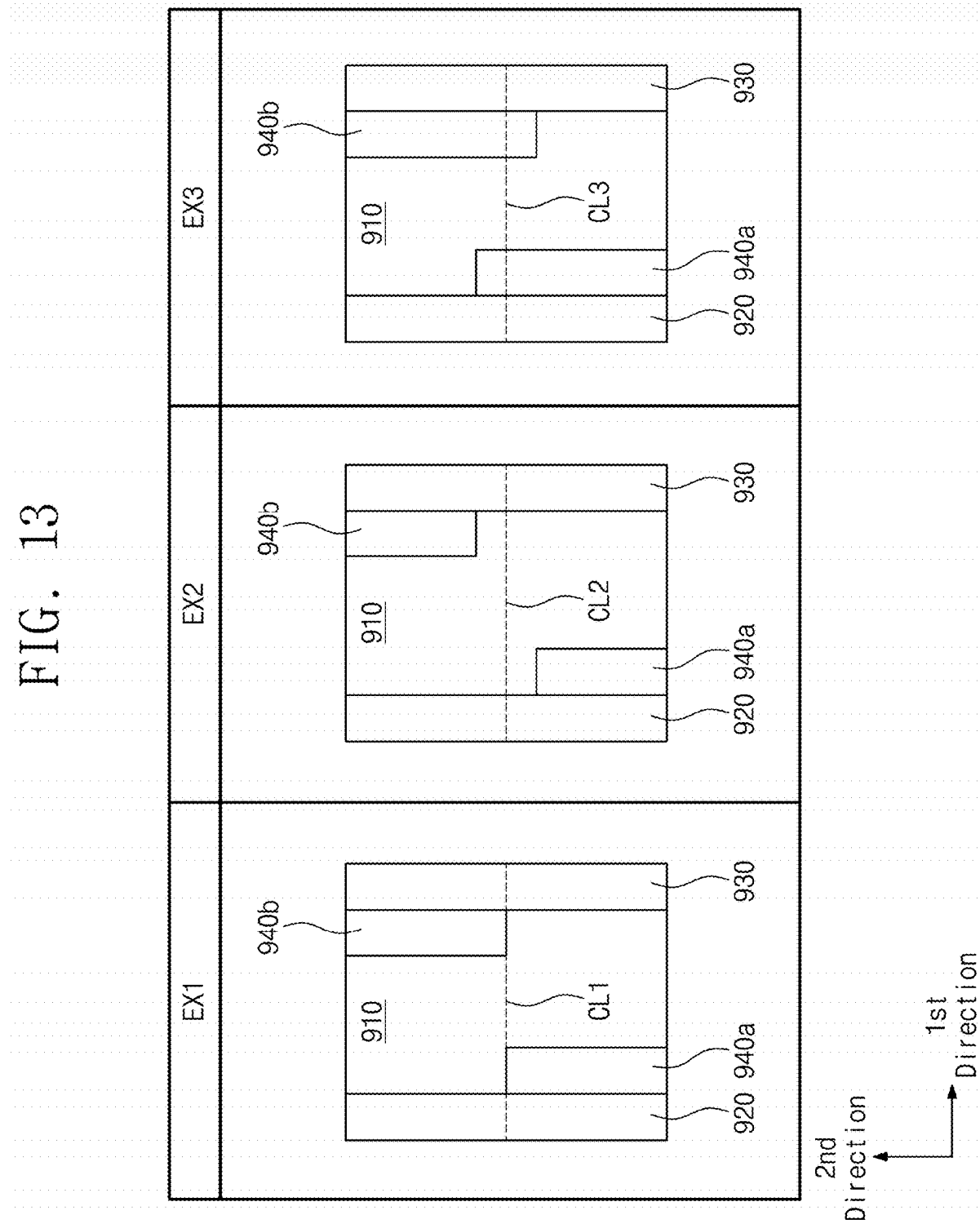
FIG. 13 illustrates examples for describing how to place a first row decoder structure, a second row decoder structure, and page buffer structures with regard to a memory cell array, when the size of a memory cell array changes.

FIG. 13 illustrates examples for describing how to place a first row decoder structure 920, a second row decoder structure 930, and page buffer structures 940a and 940b with regard to a memory cell array 910, when the size of the memory cell array 910 changes. A semiconductor device according to example embodiments may have blocks including features of EX1, features of EX2, and/or features of EX 3. Referring to a first example EX1 of FIG. 13, a length of the memory cell array 910 in the first direction may be identical to a length of the memory cell array 910 in the second direction.

The page buffer structures 940a and 940b may be placed adjacent to the first row decoder structure 920 and the second row decoder structure 930, respectively. The page buffer structures 940a and 940b may extend in the first direction and may be aligned to a first center line CL1 bisecting the memory cell array 910.

Referring to a second example EX2 of FIG. 13, the length of the memory cell array 910 in the first direction may be shorter than the length of the memory cell array 910 in the second direction. The page buffer structures 940a and 940b may be placed adjacent to the first row decoder structure 920 and the second row decoder structure 930, respectively. The page buffer structures 940a and 940b may extend in the first direction and may be spaced from a second center line CL2 bisecting the memory cell array 910.

Referring to a third example EX3 of FIG. 13, the length of the memory cell array 910 in the first direction may be longer than the length of the memory cell array 910 in the second direction. The page buffer structures 940a and 940b may be placed adjacent to the first row decoder structure 920 and the second row decoder structure 930, respectively. The page buffer structures 940a and 940b may extend in the first direction and may be spaced from a third center line CL3 bisecting the memory cell array 910.

A total length of the page buffer structures 940a and 940b in the second direction may correspond to a total length of the memory cell array 910 in the first direction or may be substantially the same as the total length of the memory cell array 910 in the first direction. Even though the length of the memory cell array 910 in the first direction and the length of the memory cell array 910 in the second direction are variously changed, as described with reference to the first to third examples EX1 to EX3 of FIG. 13, the page buffer structures 940a and 940b may be placed independently of a change in the size of the memory cell array 910 by dividing a page buffer structure into the two page buffer structures 940a and 940b.

Figure 14:
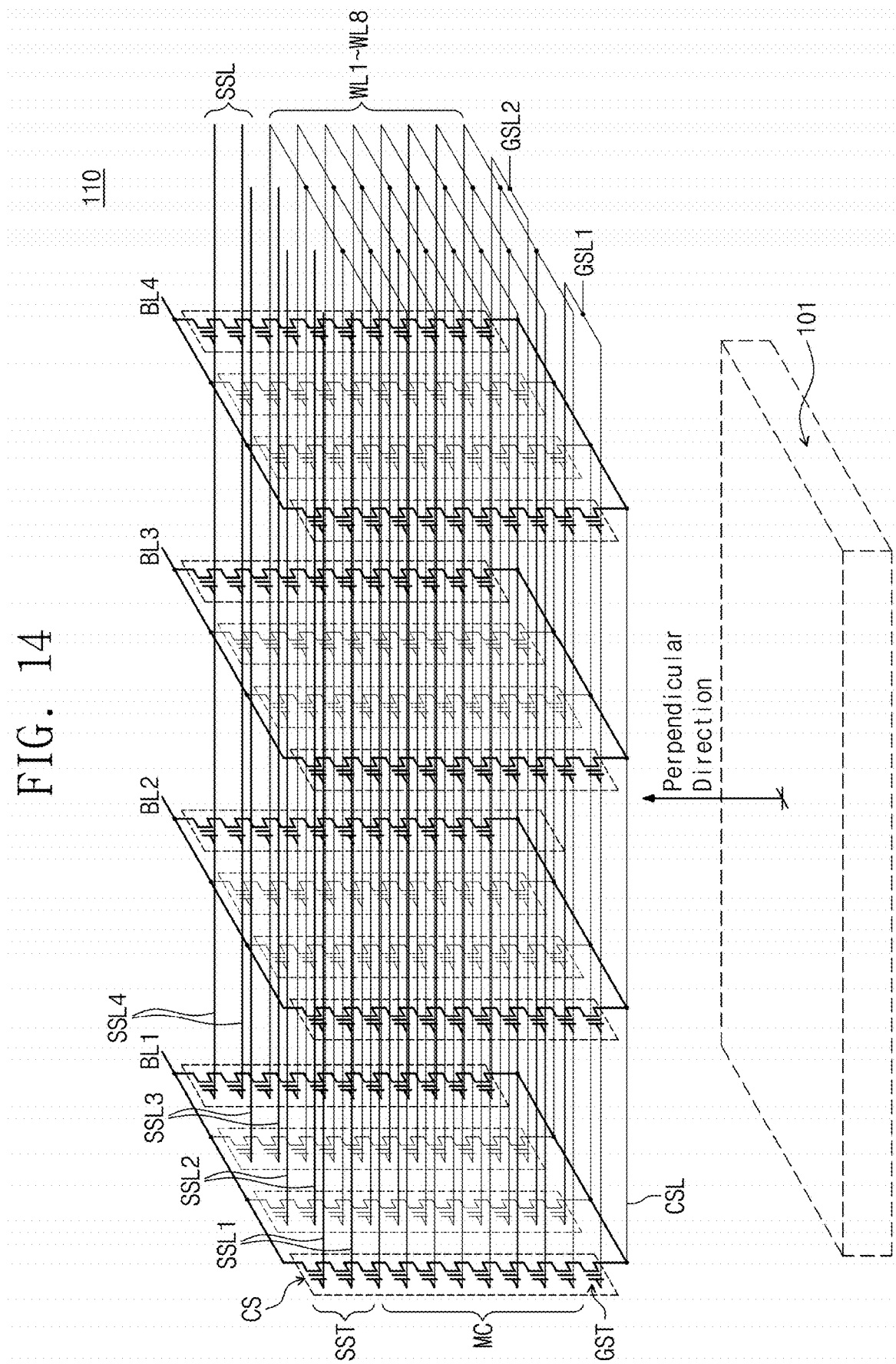
FIG. 14 illustrates an example of a portion of a memory cell array of FIG. 1.

FIG. 14 illustrates an example of a portion of the memory cell array 110 of FIG. 1. FIG. 14 is illustrated as an electrical schematic; however, it is to be understood that FIG. 14 may correspond to a physical portion of the memory cell array 110 of FIG. 1. Referring to FIGS. 1 and 14, a plurality of cell strings CS may be arranged on a substrate 101 in rows and columns. For example, the substrate 101 may correspond to the substrate 301 of the three-dimensional structure 300a of FIG. 4 and/or the substrate 501 of the three-dimensional structure 500a of FIG. 8. The plurality of cell strings CS may be connected in common to a common source line CSL formed on (or in) the substrate 101. In FIG. 14, a position of the substrate 101 is illustrated to help understand a structure of the memory cell array 110.

An example is illustrated in FIG. 14 as the common source line CSL is connected to lower ends of the cell strings CS. However, it is sufficient if the common source line CSL is electrically connected to the lower ends of the cell strings CS, and inventive concepts is not limited to the case that the common source line CSL is physically positioned at the lower ends of the cell strings CS. An example is illustrated in FIG. 14 as the cell strings CS are arranged in a 4×4 matrix; but, the number of cell strings CS in the memory cell array 110 may increase or decrease.

The cell strings CS in two rows may be connected in common to a ground selection line GSL1 or GSL2 and may be connected to corresponding string selection lines of first to fourth string selection lines SSL1 to SSL4. The cell strings CS in each column may be connected to a corresponding bit line of first to fourth bit lines BL1 to BL4. For illustration, the cell strings CS connected to the second and third string selection lines SSL2 and SSL3 are depicted to be blurred.

Each of the cell strings CS may include at least one ground selection transistor GST connected to the ground selection line GSL1 or GSL2, a plurality of memory cells MC (e.g., MC1 to MC8) respectively connected to a plurality of word lines WL1 to WL8, and string selection transistors SST respectively connected to the string selection lines SSL1, SSL2, SSL3, or SSL4.

In each of the cell strings CS, the ground selection transistor GST, the memory cells MC1 to MC8, and the string selection transistors SST may be connected in series along a direction perpendicular to the substrate 101 and may be sequentially stacked along the direction perpendicular to the substrate 101. In each of the cell strings CS, at least one of the memory cells MC1 to MC8 may be used as a dummy memory cell. The dummy memory cell may not be programmed (e.g., may be program-inhibited) and/or may be programmed differently from the remaining memory cells of memory cells MC1 to MC8 other than the dummy memory cell.

In an example embodiment, memory cells that are positioned at the same height and are associated with one string selection line SSL1, SSL2, SSL3, or SSL4 may form one physical page. Memory cells of one physical page may be connected to one sub-word line. Sub-word lines of physical pages positioned at the same height may be connected in common to one word line.

In an example embodiment, sub-word lines of physical pages positioned at the same height may be connected to each other at a height at which the sub-word lines are formed. Alternatively or additionally, sub-word lines of physical pages positioned at the same height may be indirectly connected to each other in any other layer, which has a height different from a height at which the sub-word lines are formed, such as a metal layer.

In an example embodiment, the ground selection lines GSL1 and GSL2 may be connected to corresponding core contacts of the core contacts 311, 315, 511, and 516 associated with rows of memory cells. The word lines WL1 to WL8 may be connected to corresponding core contacts of the core contacts 311, 315, 511, and 516 associated with the rows of the memory cells. The string selection lines SSL1 to SSL4 may be connected to corresponding core contacts of the core contacts 311, 315, 511, and 516 associated with the rows of the memory cells.

Figure 15:
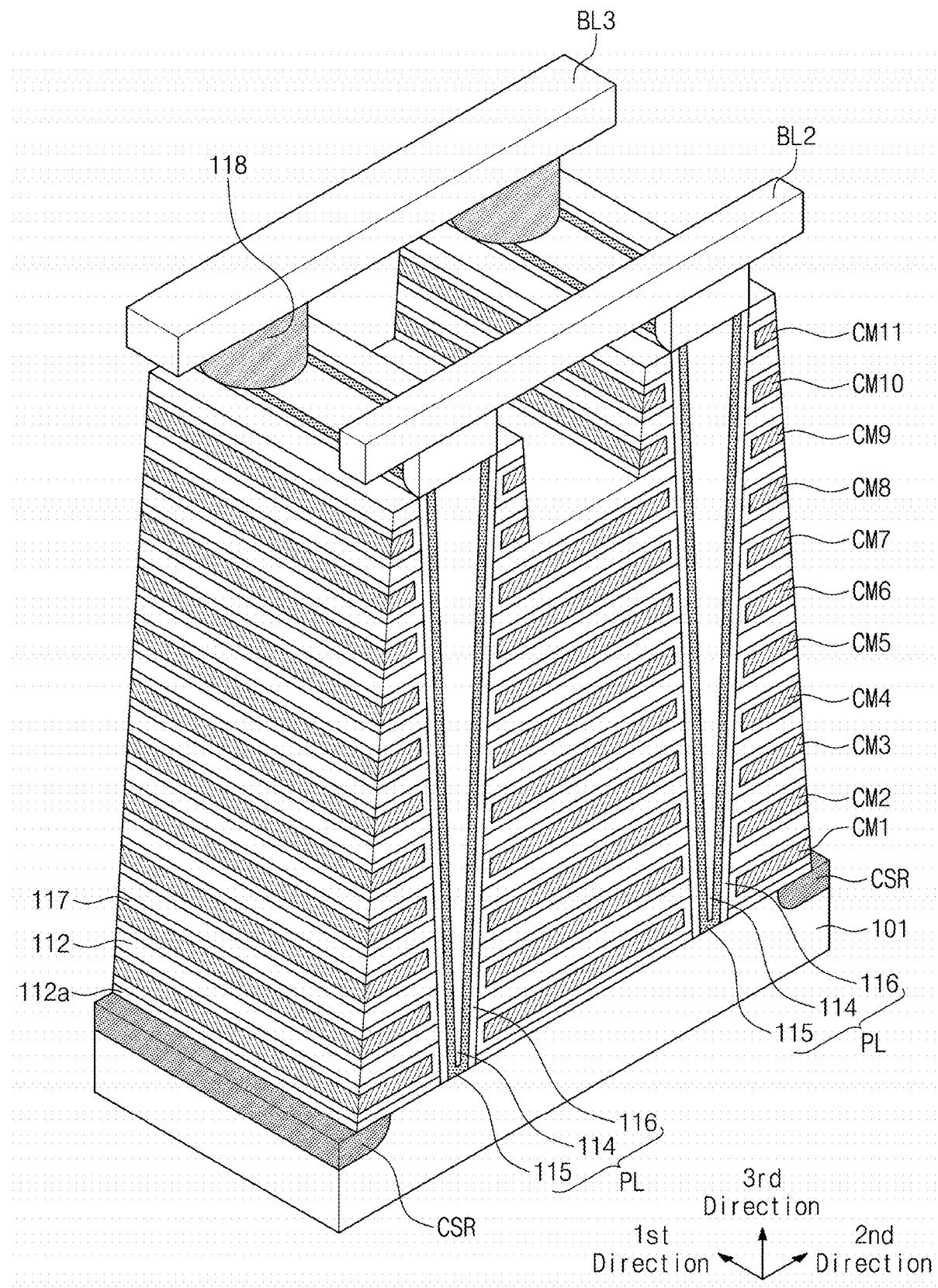
FIG. 15 is a perspective cross-sectional view of a partial structure of a memory block of FIG. 1.

FIG. 15 is a perspective cross-sectional view illustrating a partial structure of the memory cell array 110 of FIG. 1. Referring to FIGS. 1, 14, and 15, common source regions CSR that extend along the first direction and are spaced from each other along the second direction are provided on the substrate 101.

The common source regions CSR may be connected in common to form the common source line CSL. In an example embodiment, the substrate 101 may include a P-type semiconductor material. The common source regions CSR may include an N-type semiconductor material. For example, a conductive material for increasing conductivity of the common source line CSL may be disposed on the common source region CSR.

Between the common source regions CSR, insulating layers 112 and 112a are sequentially stacked on the substrate 101 along the third direction perpendicular to the substrate 101. The insulating layers 112 and 112a may be stacked to be spaced from each other along the third direction. In an example embodiment, the insulating layers 112 and 112a may include silicon oxide or silicon nitride. In an example embodiment, the thicknesses (e.g., a thicknesses in the third direction) of the insulating layer 112a, which is in contact with the substrate 101, from among the insulating layers 112 and 112a may be thinner than the thicknesses (e.g., a thicknesses in the third direction) of each of the remaining insulating layers 112.

Pillars PL that are disposed to be spaced from each other along the first direction and the second direction and penetrate the insulating layers 112 and 112a along the third direction are provided between the common source regions CSR. In an example embodiment, the pillars PL may be in contact with the substrate 101 through the insulating layers 112 and 112a. Each of the pillars PL may include an inner material 114, a channel layer 115, and/or a first insulating layer 116.

The inner material 114 may include an insulating material or an air gap. The channel layer 115 may include a doped semiconductor material such as an N-type or P-type semiconductor material, and/or or an intrinsic (e.g. undoped) semiconductor material. The first insulating layer 116 may include one or more of insulating layers (e.g., different insulating layers) such as a silicon oxide layer, a silicon nitride layer, and an aluminum oxide layer.

Between the common source regions CSR, second insulating layers 117 are provided on upper surfaces and lower surfaces of the insulating layers 112 and 112a and exposed outer surfaces of the pillars PL. There may be removed the second insulating layers 117 provided on an upper surface of the uppermost insulating layer among the insulating layers 112 and 112a.

In each of the pillars PL, the first insulating layer 116 and the second insulating layer 117 may be disposed adjacent to each other to form an information storage layer. For example, the first insulating layer 116 and the second insulating layer 117 may include oxide-nitride-oxide (ONO) and/or oxide-nitride-aluminum (ONA). The first insulating layer 116 and the second insulating layer 117 may form a tunneling insulating layer, a charge trap layer, and/or a blocking insulating layer.

Between the common source regions CSR and between the insulating layers 112 and 112a, conductive portion CM1 to CM11 are provided on exposed outer surfaces of the second insulating layers 117. The conductive portion CM1 to CM11 may include a metallic conductive portion. Drains 118 are provided on the pillars PL. In an example embodiment, the drains 118 may include an N-type semiconductor material (e.g., silicon). In an example embodiment, the drains 118 may be in contact with upper surfaces of the channel layers of the pillars PL.

The bit lines BL2 and BL3 that extend along the second direction and are spaced from each other along the first direction are provided on the drains 118. The bit lines BL2 and BL3 are connected with the drains 118. In an example embodiment, the drains 118 and bit lines (e.g., BL2 and BL3) may be connected through contact plugs. The bit lines BL2 and BL3 may include a metallic conductive portion.

The pillars PL form the cell strings CS together with the first and second insulating layers 116 and 117 and the conductive portion CM1 to CM11. Each of the pillars PL forms a cell string together with the first and second insulating layers 116 and 117 and the conductive portion CM1 to CM11, which are adjacent thereto. The first conductive portion CM1 may form the ground selection transistors GST together with the first and second insulating layers 116 and 117 and the channel layers 115 adjacent thereto. The first conductive portion CM1 may extend along the first direction to form the ground selection line GSL.

The second to ninth conductive portion CM2 to CM9 may form first to eighth memory cells MC1 to MC8 together with the first and second insulating layers 116 and 117 and the channel layers 115, which are adjacent thereto. The second to ninth conductive portion CM2 to CM9 may extend along the first direction to form first to eighth word lines WL1 to WL8, respectively.

The tenth conductive portion CM10 may form lower string selection transistors, which are relatively close to the substrate 101, from among the string selection transistors SST together with the first and second insulating layers 116 and 117 and the channel layers 115, which are adjacent thereto. The tenth conductive portion CM10 may extend along the first direction to form lower string selection lines, which are close to the substrate 101, from among the string selection lines SSL1 to SSL4.

The eleventh conductive portion CM11 may form the string selection transistors, which are adjacent to the bit lines BL1 to BL4, from among the string selection transistors SST together with the first and second insulating layers 116 and 117 and the channel layers 115, which are adjacent thereto. The eleventh conductive portion CM11 may extend along the first direction to form upper string selection lines, which are close to the substrate 101, from among the string selection lines SSL1 to SSL4.

As the first to eleventh conductive portion CM1 to CM11 are stacked along the third direction, in each cell string, the ground selection transistor GST, the memory cells MC1 to MC8, and the string selection transistors SST may be stacked along the third direction.

As the channel layer 115 is shared by the first to eleventh conductive portion CM1 to CM11 in each of the pillars PL, in each cell string, the ground selection transistor GST, the memory cells MC1 to MC8, and the string selection transistors SST may be serially connected along the third direction.

As the first to ninth conductive portion CM1 to CM9 are connected in common, the ground selection line GSL and the first to eighth word lines WL1 to WL8 may be viewed as being connected in common in the cell strings CS.

The first to eleventh conductive portion CM1 to CM11 may extend in parallel along the first direction and may be exposed. The first to eleventh conductive portion CM1 to CM11 thus exposed may be connected with corresponding core contacts of the core contacts 311, 315, 511, and 516 associated with rows of memory cells.

The memory cell array 110 may be implemented with a three-dimensional memory array. The 3D memory array is monolithically formed in one or more physical levels of arrays of memory cells MC having an active area disposed over a silicon substrate and a circuitry associated with the operation of those memory cells MC. The circuit associated with an operation of memory cells MC may be located above or within such substrate. The term "monolithic" means that layers of each level of the array are directly deposited on the layers of each underlying level of the 3D memory array.

In an example embodiment of inventive concepts, the 3D memory array includes vertical cell strings CS (or NAND strings) that are vertically oriented such that at least one memory cell is located over another memory cell. The at least one memory cell may comprise a charge trap layer. Each cell string may further include at least one selection transistor placed over the memory cells MC. The at least one selection transistor may have the same structure as the memory cells MC and may be formed uniformly with the memory cells MC.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As described above, components of the semiconductor memory device 100 are described by using the terms "first", "second", "third", and the like. However, the terms "first", "second", "third", and the like may be used to distinguish components from each other and do not limit inventive concepts. For example, the terms "first", "second", "third", and the like do not involve an order or a numerical meaning of any form.

In the above embodiments, components according to example embodiments of inventive concepts are described by using blocks. The blocks may be implemented with various hardware devices, such as an integrated circuit, an application specific IC (ASCI), a field programmable gate array (FPGA), and a complex programmable logic device (CPLD), firmware driven in hardware devices, software such as an application, or a combination of a hardware device and software. Also, the blocks may include circuits or intellectual property (IP) implemented with semiconductor elements in an integrated circuit.

According to inventive concepts, a semiconductor memory device of a memory cell array does not require a spare space for connection with a semiconductor memory device of a peripheral block. Accordingly, a semiconductor memory device having reduced costs is provided. Additionally, according to inventive concepts, a structure of a control block is opened bi-directionally. Accordingly, a semiconductor memory device having improved flexibility of design is provided. According to inventive concepts, the semiconductor memory device of the memory cell array and the semiconductor memory device of the peripheral block are manufactured separately by using different processes. Accordingly, a process based on a distinct characteristic of the memory cell array and a process based on a distinct characteristic of the peripheral block are possible, and a semiconductor memory device having improved yield may be provided.

While inventive concepts has been described with reference to example embodiments thereof, it will be apparent to those of ordinary skill in the art that various changes and modifications may be made thereto without departing from the spirit and scope of inventive concepts as set forth in the following claims.

What is claimed is:

1. A semiconductor memory device comprising:
a substrate;
first word lines over the substrate, the first word lines extending in a first direction;
first bit lines over the substrate, the first bit lines extending in a second direction;
first memory cells connected to the first word lines and the first bit lines;
first conductive materials connected to the first word lines and extending from the first word lines in a third direction, the third direction perpendicular to the first direction and the second direction;
second conductive materials connected to the first bit lines and over the first bit lines, the second conductive materials extending in the first direction; and
third conductive materials connected to the second conductive materials and extending in the third direction from the second conductive materials,
wherein the first conductive materials and the third conductive materials are configured to be connected with an external device.

2. The semiconductor memory device of claim 1, the substrate includes a plurality of edges, and the first conductive materials are arranged along the second direction at one of the plurality of edges.

3. The semiconductor memory device of claim 2, further comprising:
fourth conductive materials connected to the first word lines, arranged along the second direction at another of the plurality of edges, the fourth conductive materials extending from the first word lines in the third direction.

4. The semiconductor memory device of claim 1, wherein the third conductive materials are arranged in the second direction parallel to the first conductive materials.

5. The semiconductor memory device of claim 1, wherein the third conductive materials include:
a first group of third conductive materials arranged on one edge of a plurality of edges of the substrate; and
a second group of third conductive materials arranged on another edge of the plurality of edges, the other edge opposite to the one edge.

6. The semiconductor memory device of claim 5, wherein the second conductive materials include:
a first group of second conductive materials connected to a first group of the first bit lines, the first group of second conductive materials extending from the first group of the third conductive materials in the first direction; and
a second group of second conductive materials connected to the second group of third conductive materials, the second group of second conductive materials extending in the first direction from a second group of the first bit lines.

7. The semiconductor memory device of claim 1, further comprising:
second memory cells over the substrate, the second memory cells connected to second word lines and second bit lines, the second word lines extending in the first direction and the second bit lines extending in the second direction;
fourth conductive materials connected to the second word lines and extending from the second word lines in the third direction;
fifth conductive materials over the second bit lines, the fifth conductive materials connected to the second bit lines and extending in the first direction over the second bit lines; and
sixth conductive materials connected to the fifth conductive materials and extending from the fifth conductive materials in the third direction.

8. The semiconductor memory device of claim 7, wherein the second memory cells are arranged adjacent to the first memory cells in the second direction.

9. A semiconductor memory device comprising:
a substrate having an upper surface defined by a first direction and a second direction;
a first row decoder structure extending in the second direction on a first area of the upper surface of the substrate;
a first page buffer structure extending in the second direction on the first area of the upper surface of the substrate;
first conductive materials over the row decoder structure, the first conductive materials connected to the first row decoder structure and extending in a third direction perpendicular to the first direction and the second direction; and
second conductive materials over the first page buffer structure, the second conductive materials connected to the first page buffer structure and extending along the third direction,
wherein the first row decoder structure and the first conductive materials are placed at one edge of a plurality of edges of the first area of the upper surface of the substrate,
wherein the semiconductor device further comprises
a second row decoder structure extending along the second direction at another edge of the plurality of edges of the upper surface, the another edge opposite to the one edge; and
third conductive materials over the second row decoder structure, the third conductive materials connected to the second row decoder structure and extending in the third direction.

10. The semiconductor memory device of claim 9, wherein the first conductive materials are arranged in the second direction, and
wherein the second conductive materials are arranged parallel to the first conductive materials along the second direction.

11. The semiconductor memory device of claim 9, wherein the first conductive materials and the second conductive materials are configured to be connected to an external device.

12. The semiconductor memory device of claim 9, wherein the first page buffer structure is interposed between the first row decoder structure and the second row decoder structure.

13. The semiconductor memory device of claim 9, further comprising:
a second page buffer structure on the first area of the upper surface of the substrate, the second page buffer structure extending in the second direction; and third conductive materials connected to the second page buffer structure, arranged over the second page buffer structure along the second direction, and extending along the third direction.

14. The semiconductor memory device of claim 13, wherein the first page buffer structure and the second page buffer structure are spaced from each other in the first direction.

15. The semiconductor memory device of claim 9, further comprising:
- a second row decoder structure extending in the second direction on a second area of the upper surface of the substrate;
- a second page buffer structure extending in the second direction on the second area of the upper surface of the substrate;
- third conductive materials over the second row decoder structure, the third conductive materials connected to the second row decoder structure and extending in a third direction perpendicular to the first direction and the second direction;
- fourth conductive materials over the second page buffer structure, the fourth conductive materials connected to the second page buffer structure and extending along the third direction; and
- a control structure extending along the second direction on the first area and the second area of the upper surface of the substrate.

16. A semiconductor memory device comprising:
- a first substrate having an upper surface parallel to a first direction and a second direction crossing the first direction;
- a second substrate having an upper surface parallel to the first direction and the second direction, the upper surface of the second substrate facing the upper surface of the first substrate;
- memory cells over the upper surface of the first substrate, the memory cells connected to word lines extending along the first direction and to bit lines extending along the second direction;
- first conductive materials connected to the word lines and extending from the word lines in a third direction perpendicular to the first direction and the second direction;
- second conductive materials connected to the bit lines and extending over the bit lines in the first direction;
- third conductive materials connected to the second conductive materials and extending from the second conductive materials in the third direction;
- a row decoder structure extending on the upper surface of the second substrate, the row decoder structure extending in the second direction;
- a page buffer structure on the upper surface of the second substrate, the page buffer structure extending in the second direction;
- fourth conductive materials connected to the row decoder structure and over the row decoder structure, extending in a direction facing away from the third direction, and connected to the first conductive materials; and
- fifth conductive materials over the page buffer structure connected to the page buffer structure, extending in the direction facing away from the third direction, and connected to the third conductive materials.

17. The semiconductor memory device of claim 16, wherein the first substrate, the memory cells, the word lines, the bit lines, the first conductive materials, the second conductive materials, and the third conductive materials are fabricated on a first wafer, and
wherein the second substrate, the row decoder structure, the page buffer structure, the fourth conductive materials, and the fifth conductive materials are fabricated on a second wafer.

18. The semiconductor memory device of claim 16, wherein the page buffer structure includes a first page buffer and a second page buffer,
wherein the first page buffer is not symmetric with the second page buffer about central axes of the second substrate.

* * * * *